US007898508B2

(12) United States Patent
Kim

(10) Patent No.: US 7,898,508 B2
(45) Date of Patent: Mar. 1, 2011

(54) LIGHT EMITTING DEVICE AND METHOD OF DRIVING THE SAME

(75) Inventor: Ji Hun Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1182 days.

(21) Appl. No.: 11/543,141

(22) Filed: Oct. 5, 2006

(65) Prior Publication Data

US 2007/0252160 A1 Nov. 1, 2007

(30) Foreign Application Priority Data

Apr. 28, 2006 (KR) ........................ 10-2006-0038704
Apr. 28, 2006 (KR) ........................ 10-2006-0038711

(51) Int. Cl.

*G09G 3/30* (2006.01)
*G09G 3/32* (2006.01)
*G09G 5/00* (2006.01)
*G06F 3/038* (2006.01)
*G09G 3/34* (2006.01)
*H01L 29/18* (2006.01)
*H01L 33/00* (2006.01)
*G08B 5/22* (2006.01)
*G09F 9/33* (2006.01)

(52) U.S. Cl. ................. 345/76; 345/77; 345/78; 345/82; 345/84; 345/204; 257/88; 340/815.45

(58) Field of Classification Search .................... 257/88; 340/815.45; 345/76–84
See application file for complete search history.

(56) References Cited

U.S. PATENT DOCUMENTS 5,686,936 A * 11/1997 Maekawa et al. ............. 345/100
6,549,196 B1 * 4/2003 Taguchi et al. ............... 345/210
6,670,940 B2 * 12/2003 Kim ................................ 345/98
7,009,603 B2 3/2006 Page et al.
7,034,781 B2 4/2006 Irmer et al.
2003/0030602 A1 * 2/2003 Kasai .............................. 345/76
2004/0061672 A1 4/2004 Page et al.
2004/0160394 A1 * 8/2004 Irmer et al. ..................... 345/82
2005/0012698 A1 * 1/2005 Takahashi ........................ 345/77
2005/0156835 A1 * 7/2005 Sato ................................ 345/76
2007/0120778 A1 * 5/2007 Kimura et al. .................. 345/76

FOREIGN PATENT DOCUMENTS

EP 1 091 340 A2 4/2001
EP 1 553 551 A2 7/2005
EP 1 764 769 A1 3/2007
EP 1 793 365 A2 6/2007
WO WO 03/098974 A1 11/2003

* cited by examiner

*Primary Examiner* — Sumati Lefkowitz
*Assistant Examiner* — David Tung
(74) *Attorney, Agent, or Firm* — Morgan, Lewis & Bockius LLP

(57) ABSTRACT

The present invention relates to a light emitting device for preventing a cross-talk phenomenon and a pectinated pattern. The light emitting device includes data lines, scan lines, pixels and a discharging circuit. The data lines are disposed in a first direction, and the scan lines are disposed in a second direction different from the first direction. The pixels are formed in cross areas of the data lines and the scan lines. The discharging circuit discharges at least one data line to a first discharge voltage during a first sub-discharging time of a discharging time, and changes the first discharge voltage into a second discharge voltage during a second sub-discharging time of the discharging time. The light emitting device discharges data lines to discharge voltages corresponding to cathode voltage of pixels, and so cross-talk phenomenon and pectinated pattern is not occurred in the light emitting device.

9 Claims, 21 Drawing Sheets

LIGHT EMITTING DEVICE AND METHOD OF DRIVING THE SAME

CROSS-REFERENCE TO RELATED APPLICATIONS

This application claims priority from Korean Patent Applications No. 2006-38704, and No. 2006-38711 filed on Apr. 28, 2006, the contents of which are incorporated herein by reference in their entirety.

BACKGROUND OF THE INVENTION

1. Field of the Invention

The present invention relates to a light emitting device and a method of driving the same. More particularly, the present invention relates to a light emitting device for preventing a cross-talk phenomenon and a pectinated pattern and a method of driving the same.

2. Description of the Related Art

A light emitting device emits a light having a certain wavelength when certain voltage or current is provided thereto, and especially an organic electroluminescent device is self light emitting device.

FIG. 1 is a block diagram illustrating a common light emitting device.

In FIG. 1, the light emitting device includes a panel 100, a controller 102, a first scan driving circuit 104, a second scan driving circuit 106, a discharging circuit 108, a precharging circuit 110 and a data driving circuit 112. For example, the light emitting device is organic electroluminescent device.

The panel 100 includes a plurality of pixels E11 to E64 formed in cross areas of data lines D1 to D6 and scan lines S1 to S4.

The controller 102 receives display data from an outside apparatus (not shown), and controls the scan driving circuits 104 and 106, the discharging circuit 108, the precharging circuit 110 and the data driving circuit 112 by using the received display data.

The first scan driving circuit 104 transmits first scan signals to some of the scan lines S1 to S4, e.g. S1 and S3. The second scan driving circuit 106 transmits second scan signals to other scan lines S2 and S4. As a result, the scan lines S1 to S4 are connected in sequence to a ground.

The discharging circuit 108 is connected to the data lines D1 to D6 through switches SW1 to SW6. In addition, the discharging circuit 108 turns on the switches SW1 to SW6 when discharging, and so the data lines D1 to D6 are connected to a zener diode ZD. As a result, the data lines D1 to D6 is discharged up to a zener voltage of the zener diode ZD.

The precharging circuit 110 provides precharge current corresponding to the display data to the discharged data lines D1 to D6 in accordance with control of the controller 102.

The data driving circuit 112 provides data currents corresponding to the display data to the precharged data lines D1 to D6 under control of the controller 102. As a result, the pixels E11 to E64 emit light.

FIG. 2A and FIG. 2B are views illustrating schematically a light emitting device of FIG. 1. FIG. 2C and FIG. 2D are timing diagrams illustrating a process of driving the light emitting device.

Hereinafter, the process of driving the light emitting device will be described after describing cathode voltages VC11 to VC61 corresponding to a first scan line S1.

As shown in FIG. 2A, a resistor between a pixel E11 and the ground is Rs, and a resistor between a pixel E21 and the ground is Rs+Rp. In addition, a resistor between a pixel E31 and the ground is Rs+2Rp, and a resistor between a pixel E41 and the ground is Rs+3Rp. Further, a resistor between a pixel E51 and the ground is Rs+4Rp, and a resistor between a pixel E61 and the ground is Rs+5Rp.

Here, it is assumed that the data currents I11 to I61 having the same magnitude are provided to the data lines D1 to D6 so that the pixels E11 to E61 emit light having the same brightness.

In this case, the data currents I11 to I61 pass to a ground through corresponding pixels E11 to E61 and the first scan line S1. Accordingly, since the data currents I11 to I61 have the same magnitude, cathode voltages VC11 to VC61 of the pixels E11 to E61 are proportioned to resistor between corresponding pixel and the ground. Hence, the values are high in the order of the cathode voltages VC61, VC51, VC41, VC31, VC21 and VC11.

In FIG. 2B, a resistor between a pixel E12 and the ground is Rs+5Rp, and thus is higher than that between the pixel E11 and the ground. Here, it is assumed that the data current I11 passing through the first data line D1 when the first scan line S1 is connected to the ground is identical to data current I12 passing through the first data line D1 when a second scan line S2 is connected to the ground. In this case, because cathode voltages VC11 and VC12 of the pixels E11 and E12 are proportioned to corresponding resistor, the cathode voltage VC12 is higher than the cathode voltage VC11.

Hereinafter, a process of driving the light emitting device will be described in detail.

The switches SW1 to SW6 are turned on, and the scan lines S1 to S4 are connected to a non-luminescent source having the same magnitude (V2) as a driving voltage of the light emitting device, e.g. voltage corresponding to maximum brightness of data current. Accordingly, the pixels E11 to E64 does not emit light, and the data lines D1 to D6 are discharged to a zener voltage of the zener diode ZD during a first discharge period of time (dcha1).

Subsequently, the switches SW1 to SW6 are turned off.

Then, precharge current corresponding to first display data is provided to the data lines D1 to D6 during a first precharge period of time (pcha1) as shown in FIG. 2C and FIG. 2D.

Subsequently, the first scan line S1 is connected to the ground as shown in FIG. 2A, and the other scan lines S2 to S4 are connected to the non-luminescent source.

Then, the data currents I11 to I61 corresponding to the first display data are provided to the data lines D1 to D6 during a first luminescent period of time (t1) as shown in FIG. 2C and FIG. 2D. As a result, the pixels E11 to E61 emit light during the first luminescent period of time (t1).

Hereinafter, the pixel E61 is assumed to have the same brightness as the pixel E11. That is, the data currents I11 and I61 having the same magnitude are provided to the data lines D1 and D6 during the first luminescent period of time (t1).

First, the data lines D1 and D6 are discharged up to the same discharge voltage during the first discharge period of time (dcha1) when discharging as shown in FIG. 2D, and so the data lines D1 and D6 are precharged to the same precharge level, i.e. certain precharge voltage during a first precharge period of time (pcha1).

Subsequently, the data currents I11 and I61 having the same magnitude are provided to the data lines D1 and D6, respectively. In this case, since the pixels E11 and E61 are preset to emit light having the same brightness, anode voltages VA11 and VA61 of the pixels E11 and E61 rise from the precharge voltage to a voltage which is different from corresponding cathode voltages VC11 and VC61 by a certain level, and then the voltages VA11 and VA61 are saturated. This is because a pixel emits a light having brightness corresponding to difference of its anode voltage and its cathode voltage.

For example, in case that the cathode voltage VC11 of the pixel E11 and the cathode voltage VC61 of the pixel E61 are 1V and 2V, respectively, the anode voltage V61 of the pixel E61 is saturated with 7V when the anode voltage VA11 of the pixel E11 is saturated with 6V. In this case, because the data lines D1 and D6 are precharged up to the same precharge voltage, e.g. 3V, the anode voltage VA11 of the pixel E11 is saturated with 6V after rising from 3V up to 6V. Whereas, the anode voltage VA61 of the pixel E61 is saturated with 7V after rising 3V up to 7V. Hence, charge amount consumed until the anode voltage VA61 of the pixel E61 is saturated is higher than that consumed until the anode voltage VA11 of the pixel E11 is saturated. Accordingly, though the pixels E11 and E61 are preset to have the same brightness, the pixel E61 emits a light having brightness smaller than the pixel E11.

Hereinafter, the process of driving the light emitting device will be described continuously.

The scan lines S1 to S4 are connected to the non-luminescent source, and the switches SW1 to SW6 are turned on. As a result, the data lines D1 to D6 is discharged up to a certain discharge voltage during a second discharge period of time (dcha2) as shown in FIG. 2C.

Subsequently, the switches SW1 to SW6 are turned off, and then precharge current corresponding to second display data is provided to the data lines D1 to D6. Here, the second display data is inputted to the controller 102 after the first display data is provided to the controller 102.

Then, the second scan line S2 is connected to the ground, and the other scan lines S1, S3 and S4 are connected to the non-luminescent source.

Subsequently, data currents I12 to I62 corresponding to the second display data are provided to the data lines D1 to D6, and so pixels E12 to E62 emit light during the second luminescent period of time (t2).

Hereinafter, the pixel E12 is preset to have the same brightness as the pixel E1.

In this case, because the resistor between the pixel E12 and the ground is higher than the resistor between the pixel E11 and the ground, the cathode voltage VC12 of the pixel E12 is higher than the cathode voltage VC11 of the pixel E11. Hence, charge amount consumed until the anode voltage VA12 of the pixel E12 is saturated is higher than that consumed until the anode voltage VA11 of the pixel E11 is saturated. Accordingly, the pixel E12 emits a light having brightness smaller than the pixel E11. This phenomenon that pixels preset to have the same brightness emit really light having different brightness is referred to as "cross-talk phenomenon".

Hereinafter, the brightness of the pixels E11 to E61 corresponding to the first scan line S1 and the pixels E12 to E62 corresponding to the second scan line S2 will be compared.

As described above, the pixel E11 of the pixels E11 to E61 corresponding to the first scan line S1 emits a light having highest brightness of the pixels E11 to E61, and the pixel E61 emits a light having smallest brightness of the pixels E11 to E61. In addition, the pixel E12 of the pixels E12 to E62 corresponding to the second scan line S2 emits a light having smallest brightness of the pixels E12 to E62, and the pixel E62 emits a light having highest brightness of the pixels E12 to E62. Hence, brightness difference between the pixels E11 and E12 related to the first data line D1 and brightness difference between the pixels E61 and E62 related to the sixth data line D2 are higher than brightness difference between the pixels E21 to E52 related to the other data lines D2 to D5. As a result, line patterns are generated at a part between the pixels E11 and E12 and a part between the pixels E61 and E62 of the panel 100. This is referred to as "pectinated pattern".

SUMMARY OF THE INVENTION

It is a feature of the present invention to provide a light emitting device where cross-talk phenomenon and a pectinated pattern are not occurred and a method of driving the same.

A light emitting device according to one embodiment of the present invention includes data lines, scan lines, pixels and a discharging circuit. The data lines are disposed in a first direction, and the scan lines are disposed in a second direction different from the first direction. The pixels are formed in cross areas of the data lines and the scan lines. The discharging circuit discharges at least one data line to a first discharge voltage during a first sub-discharging time of a discharging time, and changes the first discharge voltage into a second discharge voltage during a second sub-discharging time of the discharging time. Here, the second discharge voltage is different from the first discharge voltage.

A light emitting device according to another embodiment of the present invention includes data lines, scan lines, pixels and a discharging circuit. The data lines are disposed in a first direction. The scan lines are disposed in a second direction different from the first direction. The pixels are formed in cross areas of the data lines and the scan lines. The discharging circuit provides output voltages corresponding to data of M (integer of above 2) bit to the data lines so that the data lines have discharge voltages corresponding to cathode voltage of pixel related to the data lines.

A method of driving a light emitting device having a plurality of pixels formed in cross areas of data lines and scan lines according to one embodiment of the present invention includes providing a first output voltage to at least one data line during a first sub-discharging time of a discharging time, thereby discharging the data line to a first discharge voltage; and providing a second output voltage to the data line during a second sub-discharging circuit of the discharging time, thereby changing the first discharge voltage into a second discharge voltage. Here, the second discharge voltage is different from the first discharge voltage.

A method of driving a light emitting device having a plurality of pixels formed in cross areas of data lines and scan lines according to another embodiment of the present invention includes selecting a first data of data of M (integer of above 2) bit; providing a first output voltage corresponding to the selected first data to at least one data line; selecting a second data of the data of M bit; and providing a second output voltage corresponding to the selected second data to the data line.

As described above, a light emitting device and a method of driving the same discharge data lines up to discharge voltages corresponding to cathode voltage of pixels related to the data lines, and so a cross-talk phenomenon and a pectinated pattern is not occurred in the light emitting device.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF EMBODIMENTS

Hereinafter, the preferred embodiments of the present invention will be explained in more detail with reference to the accompanying drawings.

Figure 1:
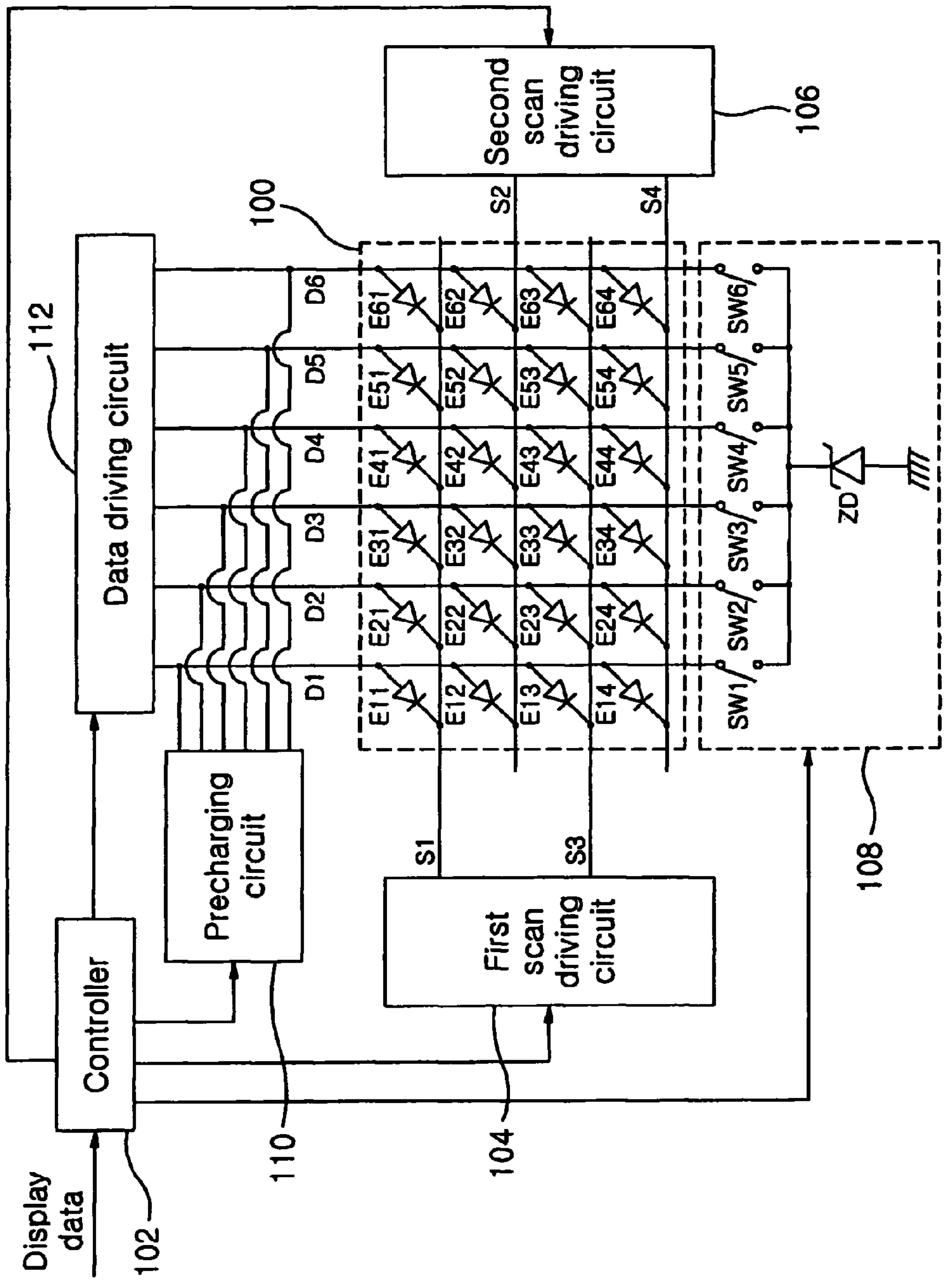
FIG. 1 Related Art
FIG. 1 is a block diagram illustrating a common light emitting device.
Figure 2A:
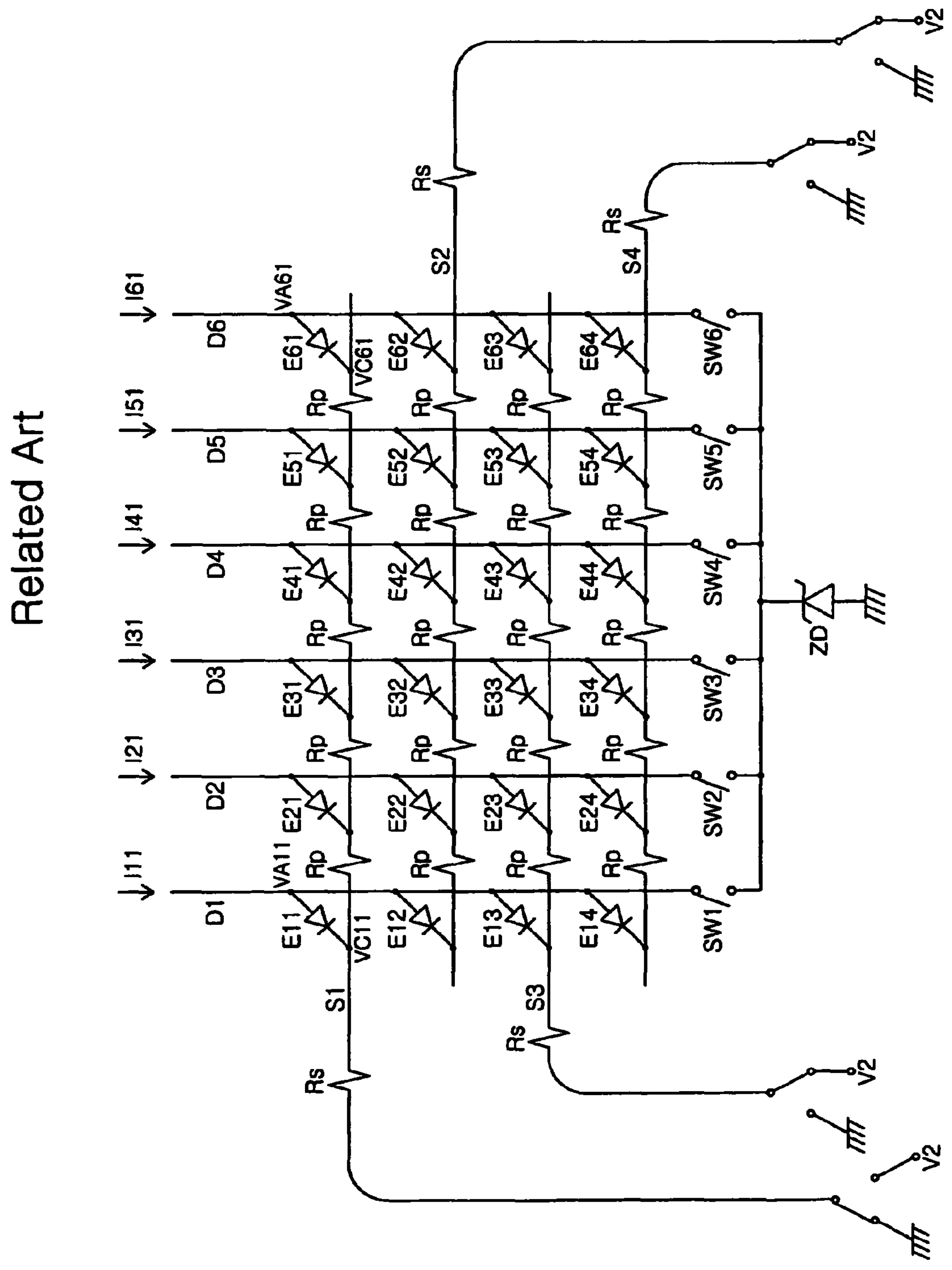
FIG. 2A and FIG. 2B are views illustrating schematically a light emitting device of FIG. 1.
Figure 2B:
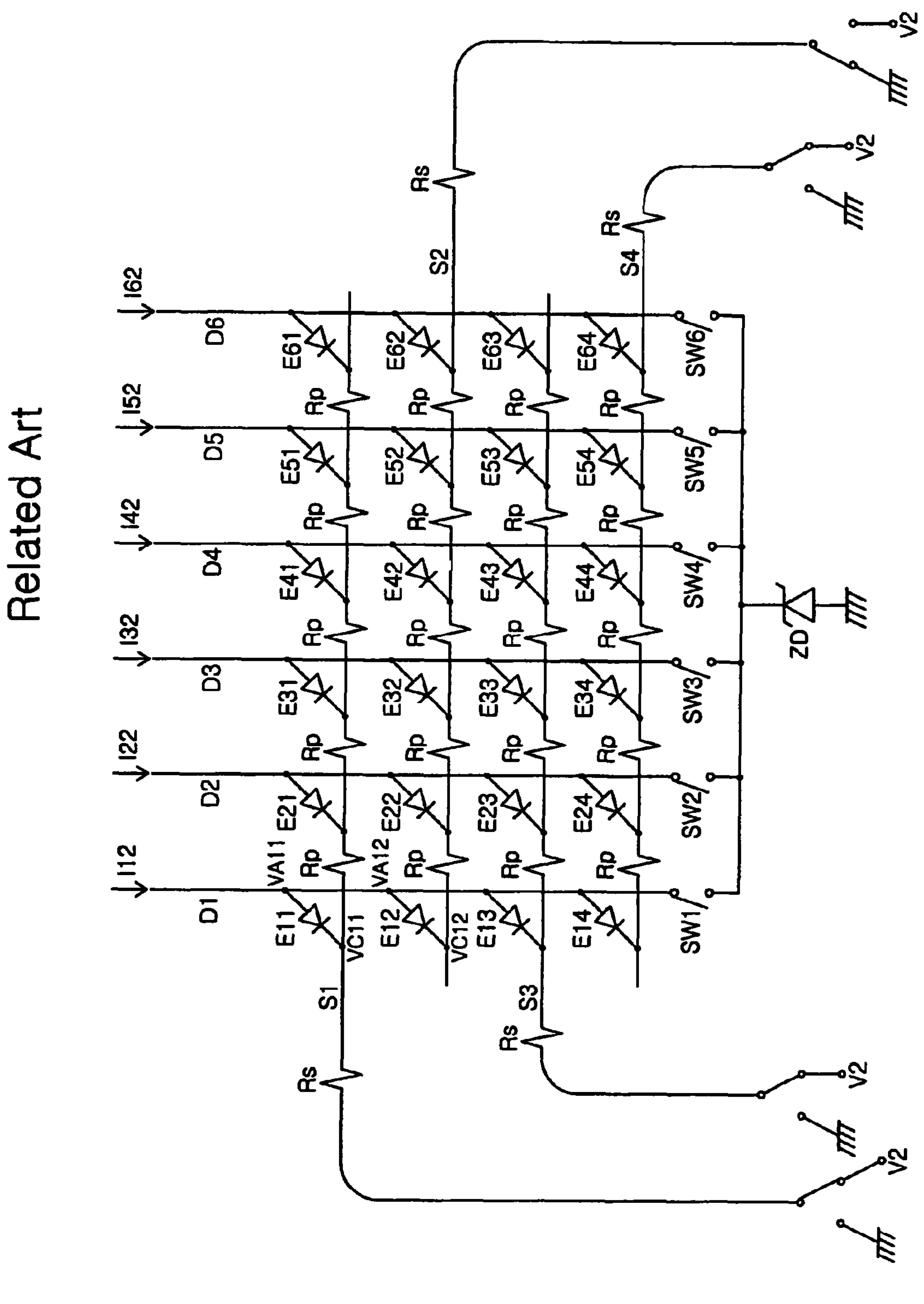
Figure 2C:
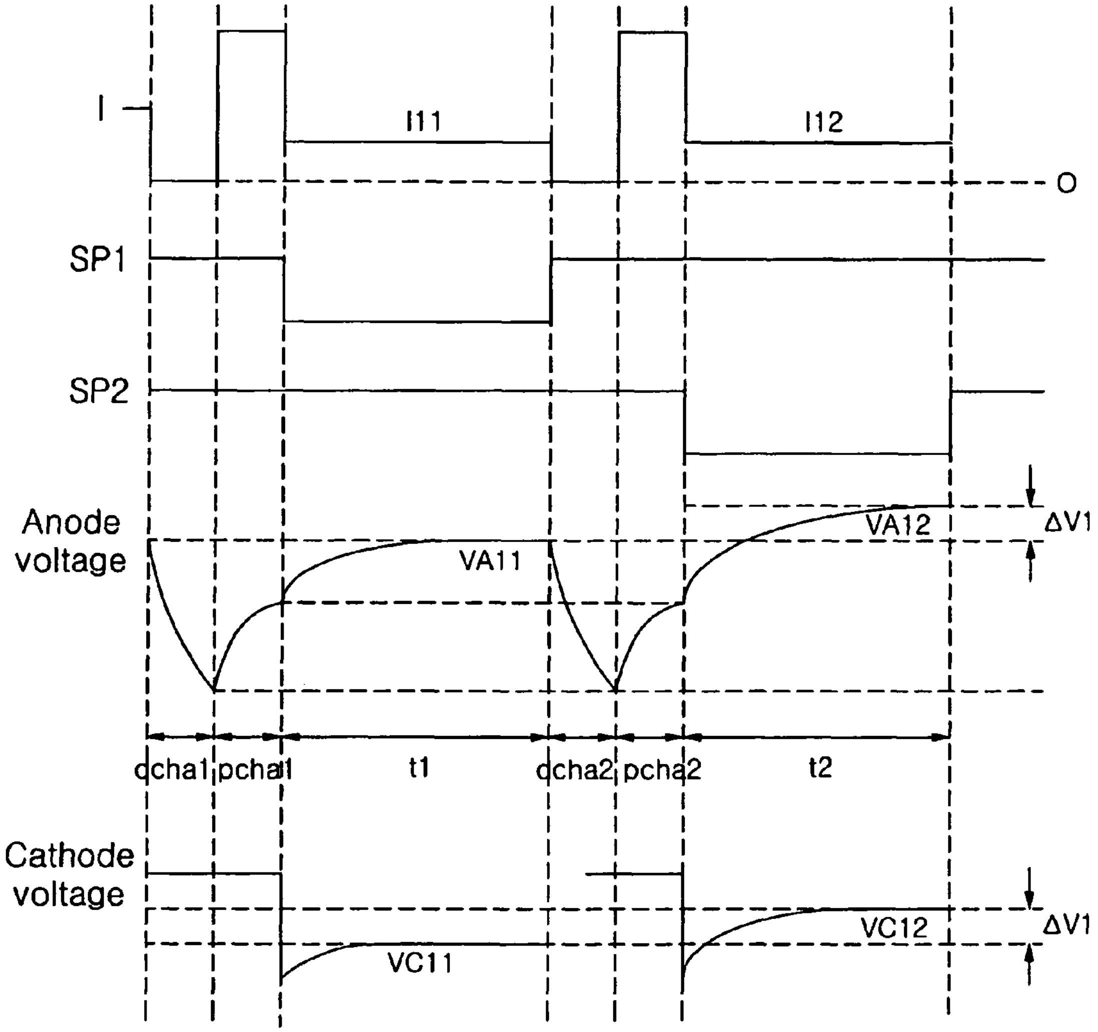
FIG. 2C Related Art
FIG. 2C and FIG. 2D are timing diagrams illustrating a process of driving the light emitting device.
Figure 2D:
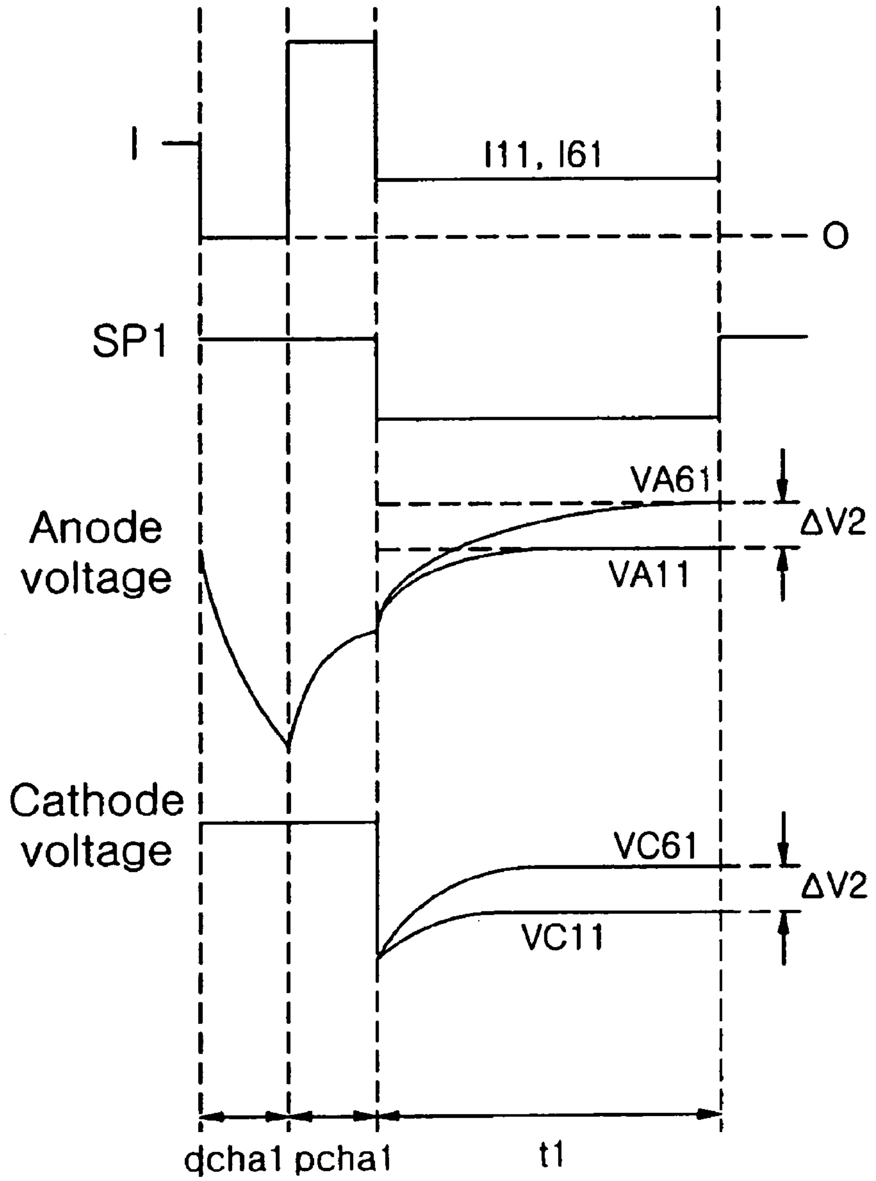
FIG. 2D Related Art
Figure 3A:
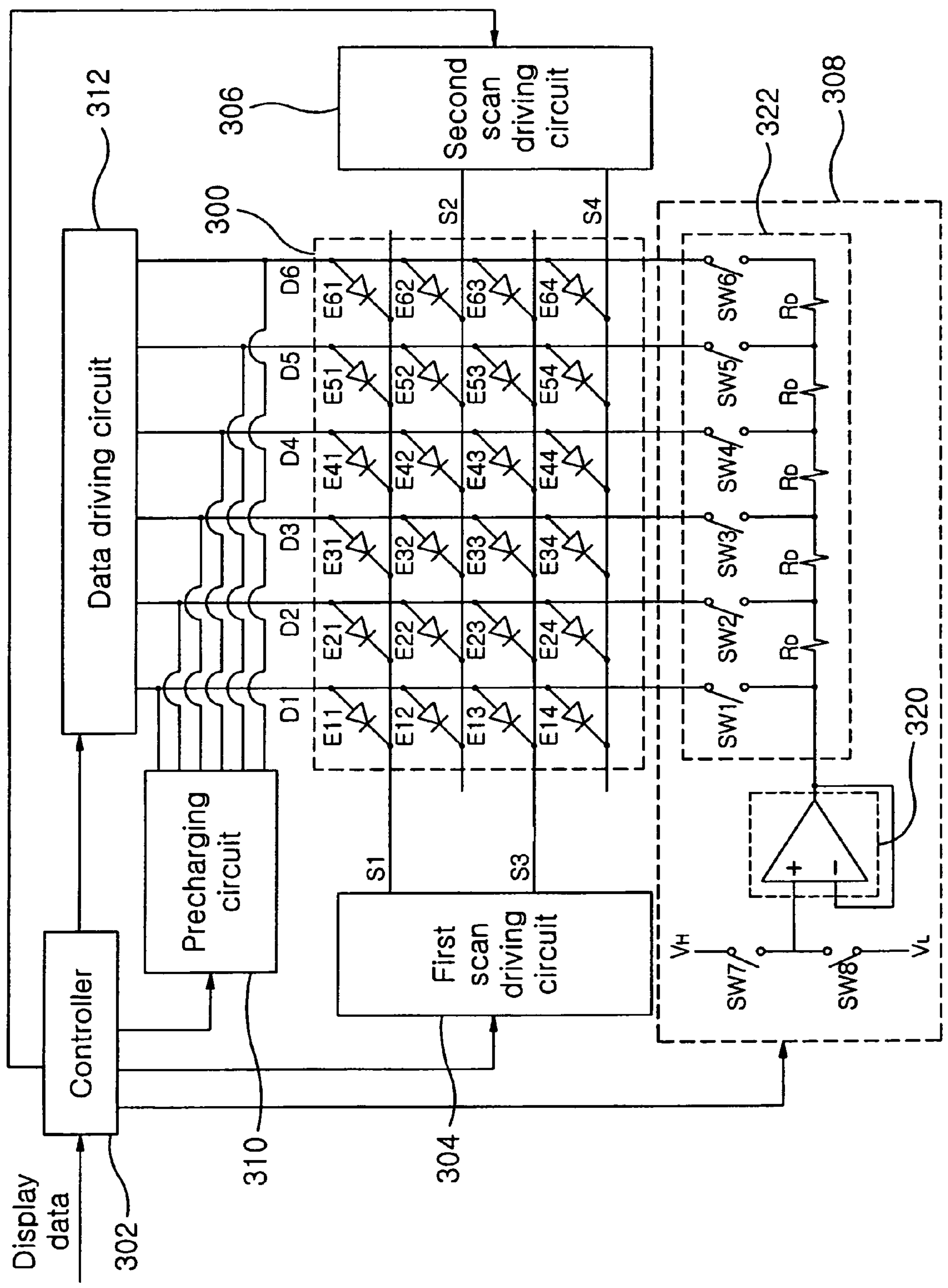
FIG. 3A is a view illustrating a light emitting device according to a first embodiment of the present invention.
Figure 3B:
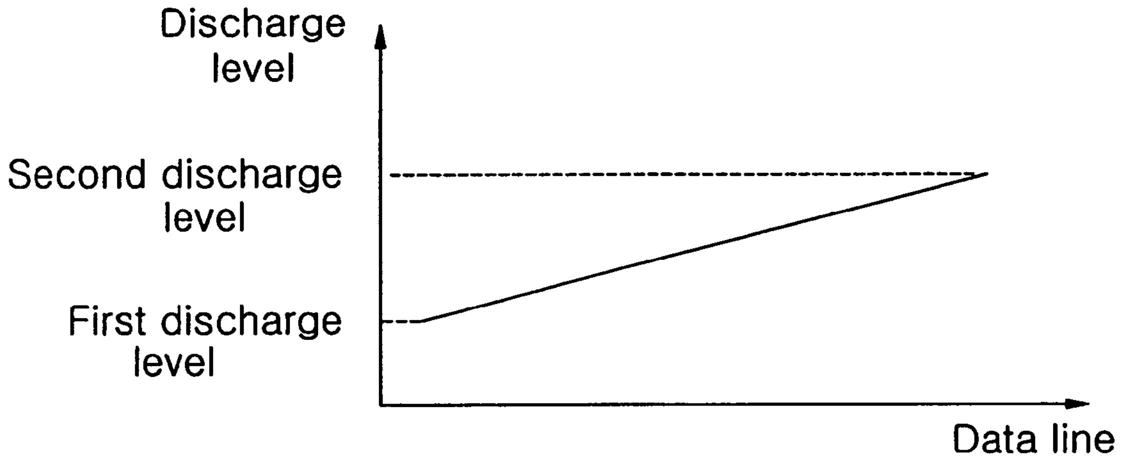
FIG. 3B is a view illustrating a discharge level graph in accordance with operation of a discharging circuit in FIG. 3A.

FIG. 3A is a view illustrating a light emitting device according to a first embodiment of the present invention. FIG. 3B is a view illustrating a discharge level graph in accordance with operation of a discharging circuit in FIG. 3A.

In FIG. 3A, the light emitting device of the present invention includes a panel 300, a controller 302, a first scan driving circuit 304, a second scan driving circuit 306, a discharging circuit 308, a precharging circuit 310 and a data driving circuit 312.

The light emitting device according to one embodiment of the present invention includes an organic electroluminescent device, a plasma display panel, a liquid crystal display, and others. Hereinafter, the organic electroluminescent device will be described as an example of the light emitting device for convenience of the description.

The panel 300 includes a plurality of pixels E11 to E64 formed in cross areas of data lines D1 to D6 and scan lines S1 to S4.

At least one of the pixels E11 to E64 has an anode electrode layer, an organic layer and a cathode electrode layer formed in sequence on a substrate.

The controller 302 receives display data, e.g. RGB data from an outside apparatus, and controls the scan driving circuits 304 and 306, the discharging circuit 308, the precharging circuit 310 and the data driving circuit 312 by using the received display data. In addition, the controller 302 may store the received display data in a memory included therein.

The first scan driving circuit 304 transmits first scan signals to some of the scan lines S1 to S4, e.g. S1 and S3.

The second scan driving circuit 306 transmits second scan signals to the other scan lines S2 and S4. As a result, the scan lines S1 to S4 are coupled in sequence to a luminescent source, e.g. ground.

The discharging circuit 308 discharges the data lines D1 to D6 up to discharge voltages corresponding to cathode voltages of pixels related thereto, and includes a sub-discharging circuit 320 and a discharging level circuit 322.

The discharging level circuit 322 includes a plurality of switches SW1 to SW6 for coupling the data lines D1 to D6 to the sub-discharging circuit 320.

The sub-discharging circuit 320 provides a certain voltage to the data lines D1 to D6 during a first sub-discharging period of time of a discharging period of time, thereby discharging the data lines D1 to D6 up to a first discharge level. Here, the switches SW1 to SW6 are turned on during the first sub-discharging period of time.

Subsequently, the sub-discharging circuit 320 provides a certain voltage to the data lines D1 to D6 during a second sub-discharging period of time of the discharging period of time. As a result, the data lines D1 to D6 are discharged up to a plurality of discharge voltages having values between the first discharge level and the second discharge level as shown in FIG. 3B. That is, the data lines D1 to D6 are discharged up to discharge voltages having constant slope (straight line or curve) as shown in FIG. 3B. Here, the discharge voltages correspond to cathode voltages of pixels related to the data lines D1 to D6 described below.

As described above, the second discharge level is higher than the first discharge level as shown in FIG. 3B. However, the first discharge level may be higher than the second discharge level in accordance with disposition direction of scan line. This will be described in detail with reference to the accompanying drawings.

The precharging circuit 310 provides precharge currents corresponding to the display data to the discharged data lines D1 to D6 under control of the controller 302.

The data driving circuit 312 provides data signals, i.e. data currents corresponding to the display data and synchronized with the scan signals to the precharged data lines D1 to D6 under control of the controller 302. As a result, the pixels E11 to E64 emit light.

Hereinafter, a process of driving the light emitting device of the present invention will be described in detail.

The first scan line S1 is coupled to a ground, and the other scan lines S2 to S4 are coupled to a non-luminescent source having the same magnitude (V2) as a driving voltage of the light emitting device, e.g. voltage corresponding to maximum brightness of data current.

Then, first data currents corresponding to first display data are provided to the data lines D1 to D6. In this case, the first data currents are passed to the ground through the pixels E11 to E61 related to the data lines D1 to D6 and the first scan line S1. As a result, the pixels E11 to E61 corresponding to the first scan line S1 emit light.

Subsequently, the data lines D1 to D6 are discharged up to discharge voltages corresponding to cathode voltages of the pixels E12 to E62 during a second discharge period of time.

Then, the data lines D1 to D6 are precharged up to precharge voltages corresponding to second display data inputted to the controller 302 after the first display data is inputted to the controller 302.

Subsequently, the second scan line S2 is coupled to the ground, and the other scan lines S1, S3 and S4 are coupled to the non-luminescent source.

Then, second data currents corresponding to the second display data are provided to the data lines D1 to D6, and so pixels E12 to E62 related to the second scan line S2 emit light.

Pixels E13 to E63 corresponding to a third scan line S3 emit light, and then pixels E14 to E64 corresponding to a fourth scan line S4 emit light through the method described above. Then, the above process of emitting light in the pixels E11 to E64 is repeated in units of the scan lines S1 to S4, i.e. frame.

Figure 4A:
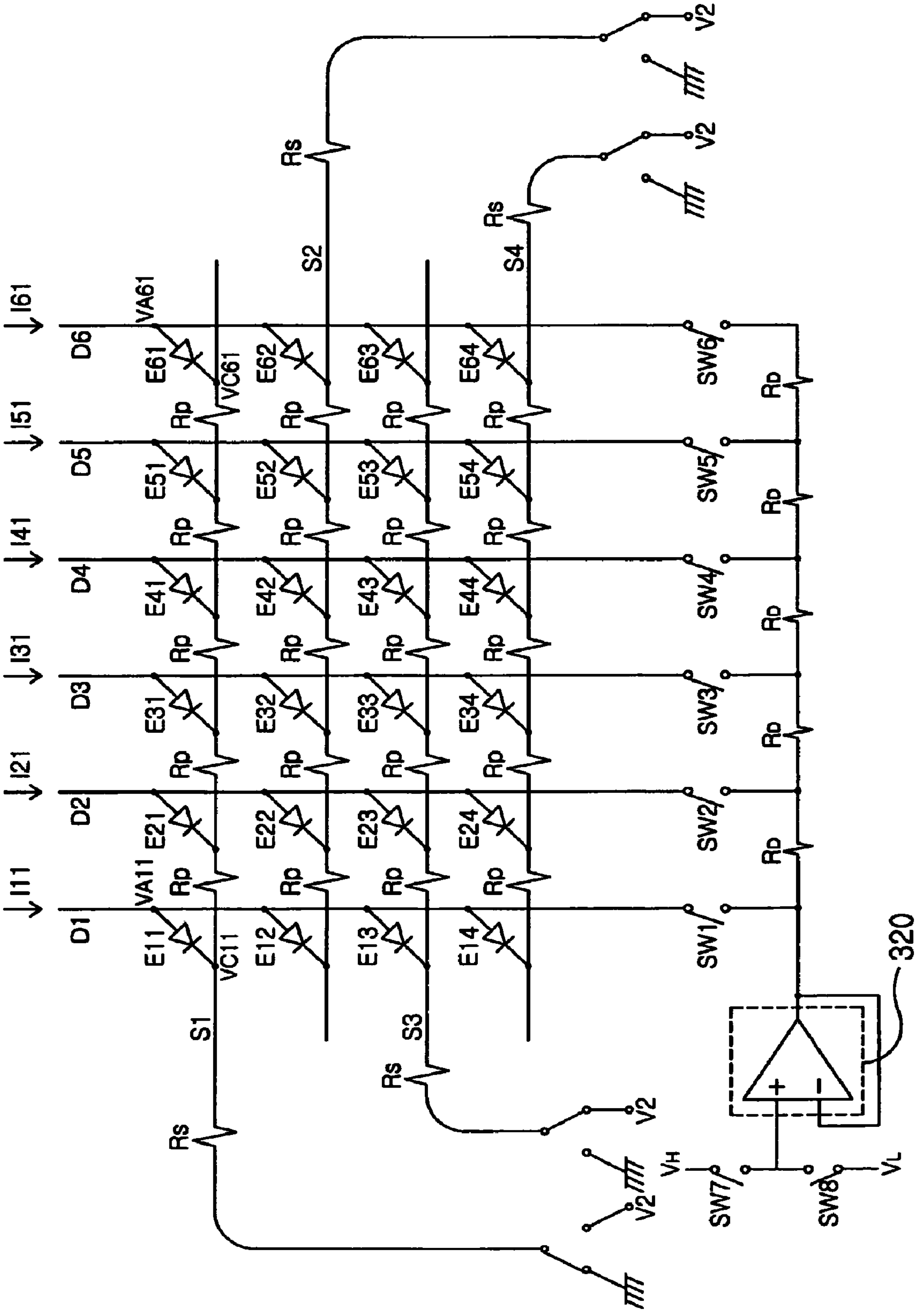
FIG. 4A and FIG. 4B are views illustrating schematically circuitries of the light emitting device in FIG. 3A.
Figure 4B:
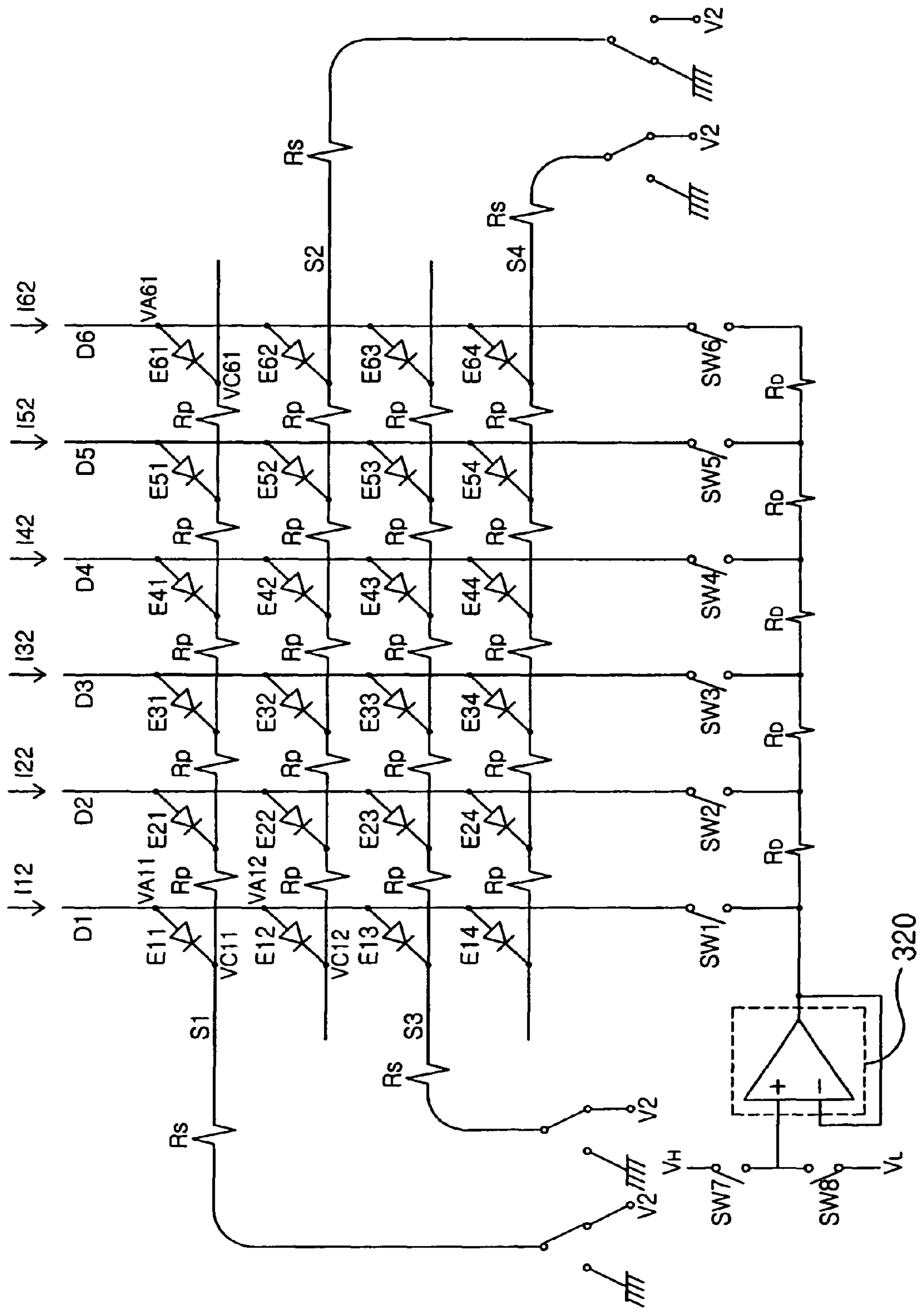
Figure 4C:
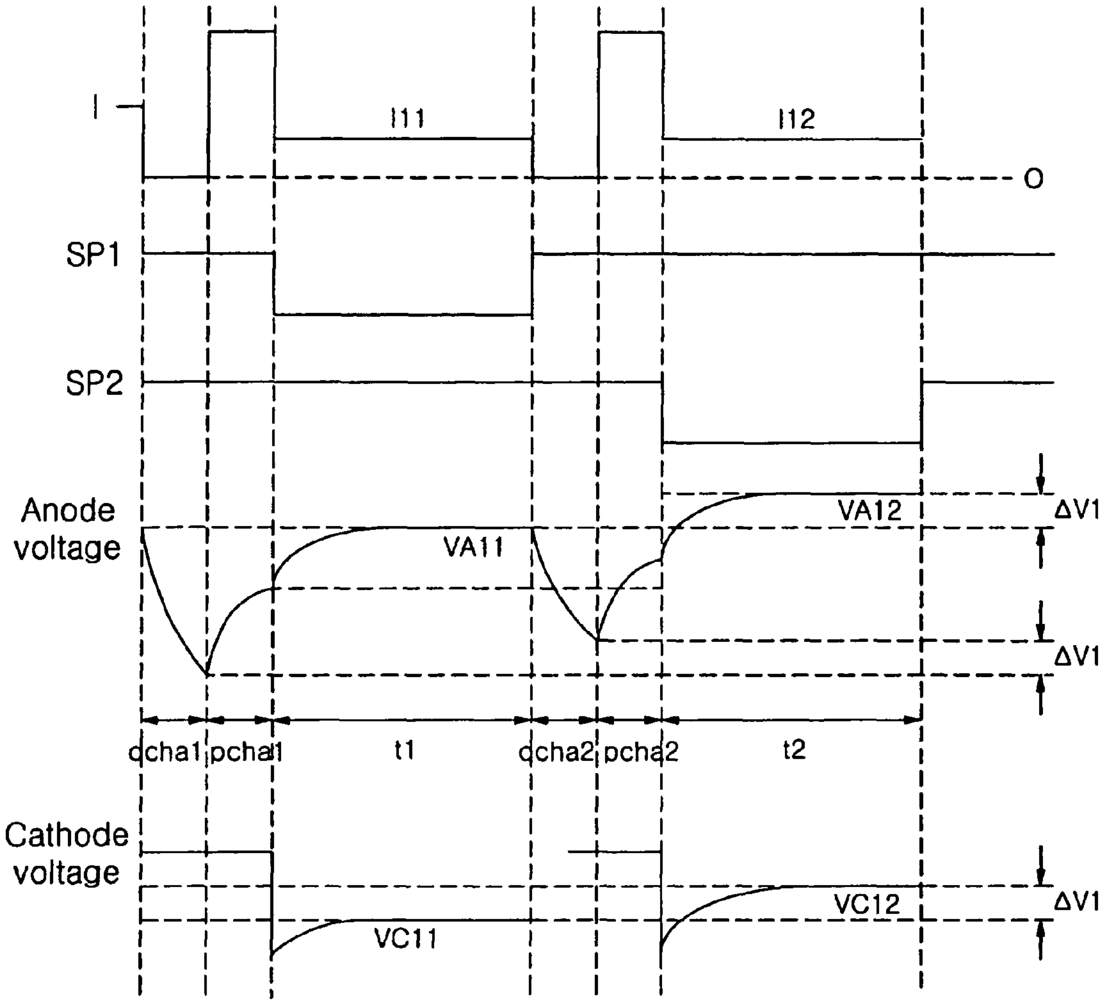
FIG. 4C and FIG. 4D are timing diagrams illustrating a process of driving the light emitting device.
Figure 4D:
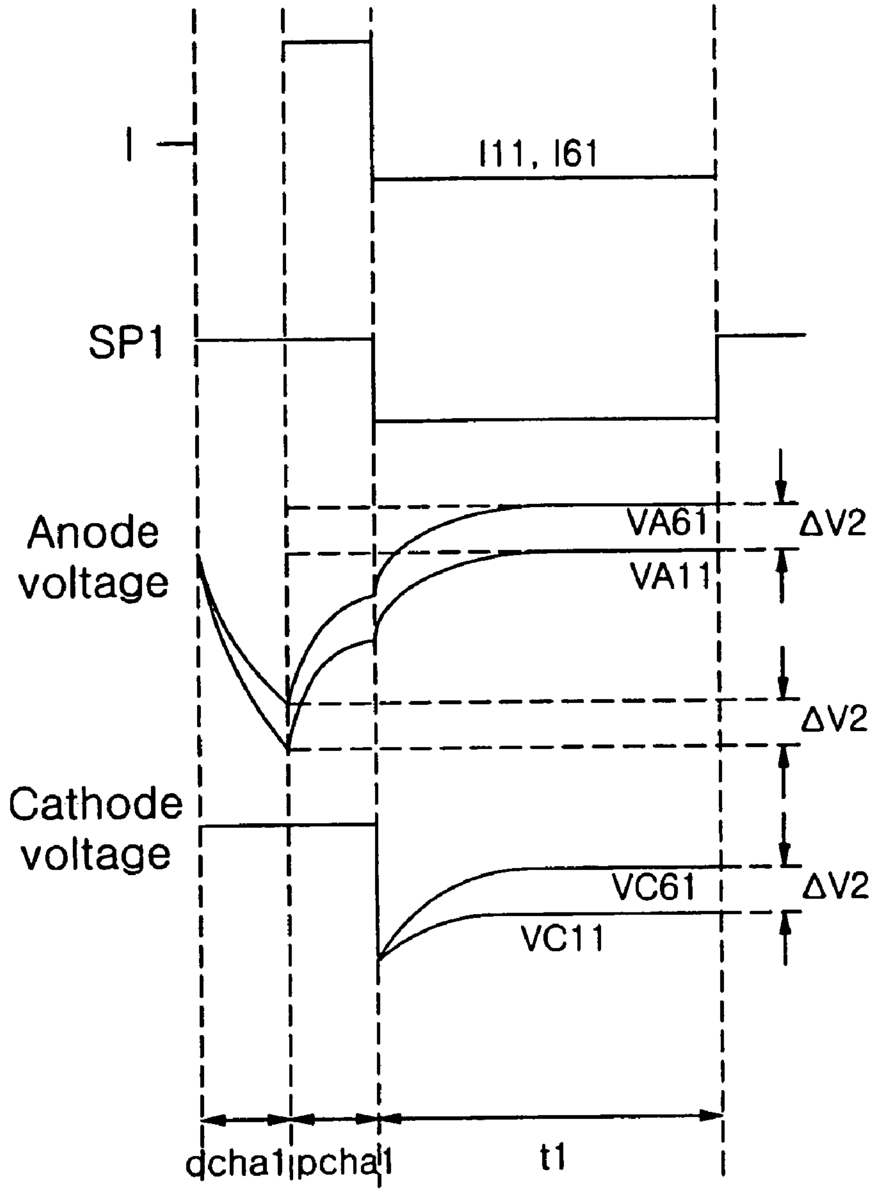

FIG. 4A and FIG. 4B are views illustrating schematically circuitries of the light emitting device in FIG. 3A. FIG. 4C and FIG. 4D are timing diagrams illustrating a process of driving the light emitting device.

In FIG. 4A, the sub-discharging circuit 320 includes an OP amplifier, its input terminal is coupled to a first voltage source having a first voltage ($V_H$) or a second voltage source having a second voltage ($V_L$). Here, the second voltage ($V_L$) is lower than the first voltage ($V_H$).

Hereinafter, a process of driving the light emitting device will be described after cathode voltages VC11 to VC61 of the pixels E11 to E61 related to the first scan line S1 are compared.

As shown in FIG. 4A, a resistor between the pixel E11 and the ground is Rs, and a resistor between the pixel E21 and the ground is Rs+Rp. In addition, a resistor between a pixel E31 and the ground is Rs+2Rp, and a resistor between a pixel E41 and the ground is Rs+3Rp. Further, a resistor between a pixel E51 and the ground is Rs+4Rp, and a resistor between a pixel E61 and the ground is Rs+5Rp.

Here, it is assumed that data currents I11 to I61 having the same magnitude are provided to the data lines D1 to D6 so that the pixels E11 to E61 have the same brightness.

In this case, the data currents I11 to I61 are passed to the ground through corresponding pixel and the first scan line S1. Accordingly, since the data currents I11 to I61 have the same magnitude, each of the cathode voltages VC11 to VC61 of the pixels E11 to E61 are proportioned to resistor between the corresponding pixel and the ground. Hence, the values are high in the order of VC61, VC51, VC41, VC31, VC21 and VC11.

In FIG. 4B, a resistor between a pixel E12 and the ground is Rs+5Rp, and is higher than the resistor between the pixel E11 and the ground. Here, it is assumed that the data current I11 passing through the first data line D1 when the first scan line S1 is coupled to the ground is identical to data current I12 passing through the first data line D1 when a second scan line S2 is coupled to the ground. In this case, because cathode voltages VC11 and VC12 of the pixels E11 and E12 are proportioned to corresponding resistor, the cathode voltage VC12 is higher than the cathode voltage VC11.

Hereinafter, the process of driving the light emitting device will be described in detail.

The discharging circuit 308 discharges the data lines D1 to D6.

Hereinafter, a process of discharging the data lines D1 to D6 will be described in detail. Here, the scan lines S1 to S4 are coupled to the non-luminescent source having voltage V2 during a first discharge period of time (dcha1), and the first scan line S1 is coupled to the luminescent source, e.g. ground during a luminescent time (t1).

In a first instance, the switches SW1, SW2, SW3, SW4, SW5, SW6 and SW8 are turned on during a first sub-discharge period of time of the first discharge period of time (dcha1).

Subsequently, the discharging circuit 308 provides a first output voltage corresponding to the second voltage ($V_L$) to the data lines D1 to D6, and so the data lines D1 to D6 are discharged up to a first discharge voltage, e.g. first discharge level corresponding to the first output voltage.

Then, the switches SW1 to SW6 keeps on condition, the switch SW8 is turned off, and the switch SW7 is turned on during a second sub-discharge period of time of the first discharge period of time (dcha1).

Subsequently, the discharging circuit 308 provides a second output voltage corresponding to the first voltage ($V_H$) to the data lines D1 to D6. In this case, the switches SW1 to SW6 are turned off in sequence in units of N (integer of above 1, preferably 1) switch in the direction of the data line D6 from the data line D1. For example, in case that N is 1, the switches SW1 to SW6 are turned off in order of SW1, SW2, SW3, SW4, SW5 and SW6. Accordingly, the data lines D1 to D6 are discharged up to the discharge voltages having the slope as shown in FIG. 3B, e.g. discharge voltages corresponding to cathode voltages of pixels related to the data lines D1 to D6.

In one embodiment of the present invention, the discharging circuit 308 provides a first current corresponding to the second voltage ($V_L$) and a second current corresponding to the first voltage ($V_H$) to the data lines D1 to D6 by using the above method so that the data lines D1 to D6 are discharged up to the discharge voltages having the slope shown in FIG. 3B.

In a second instance, the switches SW1, SW2, SW3, SW4, SW5, SW6 and SW7 are turned on during the first sub-discharge period of time of the first discharge period of time (dcha1).

Then, the discharging circuit 308 provides the second output voltage corresponding to the first voltage ($V_H$) to the data lines D1 to D6, and so the data lines D1 to D6 are discharged up to a second discharge voltage, e.g. second discharge level corresponding to the second output voltage.

Subsequently, the switches SW1 to SW6 keep on condition, the switch SW7 is turned off, and the switch SW8 is turned off during the second sub-discharge period of time of the first discharge period of time (dcha1).

Then, the discharging circuit 308 provides the first output voltage corresponding to the second voltage ($V_L$) to the data lines D1 to D6. In this case, the switches SW1 to SW6 are turned off in sequence in units of N (integer of above 1, preferably 1) switch in the direction of the data line D1 from the data line D6. For example, in case that N is 1, the switches SW1 to SW6 are turned off in order of SW6, SW5, SW4, SW3, SW2 and SW1. Accordingly, the data lines D1 to D6 are discharged up to the discharge voltages having the slope as shown in FIG. 3B, e.g. discharge voltages corresponding to cathode voltages of pixels related to the data lines D1 to D6. In above case, since the cathode voltage VC61 is higher than the cathode voltage VC11, the second discharge voltage is higher than the first discharge voltage.

Hereinafter, the pixel E61 is preset to have the same brightness as the pixel E11. That is, data currents I11 and I61 having the same magnitude are provided to the data lines D1 and D6 during a first luminescent period of time t1.

In this case, because the cathode voltage VC61 is higher than the cathode voltage VC11, the data line D6 is discharged up to a discharge voltage higher than a discharge voltage corresponding to the data line D1 during the first discharge period of time (dcha1) as shown in FIG. 4D. Thus, the data line D6 is precharged up to a second precharge voltage higher than a first precharge voltage corresponding to the data line D1.

Subsequently, the first scan line S1 is coupled to the ground, and the other scan lines S2 to S4 are coupled to the non-luminescent source.

Then, the data currents I11 and I61 having the same magnitude and corresponding to first display data are provided to the data lines D1 and D6, respectively. In this case, since the pixels E11 and E61 are preset to emit light having the same brightness, anode voltages VA11 and VA61 of the pixels E11 and E61 rise from the precharge voltage to a voltage which is different from corresponding cathode voltages VC11 and VC61 by a certain level, and then the voltages VA11 and VA61 are saturated. This is because a pixel emits a light having brightness corresponding to difference of its anode voltage and its cathode voltage.

For example, in case that the cathode voltage VC11 of the pixel E11 and the cathode voltage VC61 of the pixel E61 are 1V and 2V, respectively, the anode voltage V61 of the pixel E61 is saturated with 7V when the anode voltage VA11 of the pixel E11 is saturated with 6V. In this case, because the data line D6 is precharged up to the second precharge voltage higher than the first precharge voltage corresponding to the data line D1, the anode voltage VA11 of the pixel E11 rises from the first precharge voltage, e.g. 3V to 6V, and then is saturated with 6V. Whereas, the anode voltage VA61 of the pixel E61 rises from the second precharge voltage, e.g. 4V to 7V, and then is saturated with 7V. In other words, the anode voltages VA11 and VA61 of the pixels E11 and E61 rise from corresponding cathode voltages VC11 and VC61 by the same level as shown in FIG. 4D, and then are saturated. Accordingly, charge amount consumed until the anode voltage VA61 of the pixel E61 is saturated is substantially identical to that consumed until the anode voltage VA11 of the pixel E11 is saturated. Hence, in case that the pixels E11 and E61 are preset to emit light having the same brightness, the brightness (VA61-VC61) of the pixel E61 is substantially identical to the brightness (VA11-VC11) of the pixel E11.

Hereinafter, the process of driving the light emitting device will be continuously described.

The discharging circuit 308 discharges the data lines D1 to D6 during the second discharge period of time (dcha2).

Hereinafter, a process of the discharging will be described in detail using instances.

In a first instance, the switches SW1, SW2, SW3, SW4, SW5, SW6 and SW8 is turned on during a first sub-discharge period of time of the second discharge period of time (dcha2).

Subsequently, the discharging circuit 308 provides a first output voltage corresponding to the second voltage ($V_L$) to the data lines D1 to D6, and so the data lines D1 to D6 are discharged up to the first discharge voltage corresponding to the first output voltage.

Then, the switches SW1 to SW6 keeps on condition, the switch SW8 is turned off, and the switch SW7 is turned on during a second sub-discharge period of time of the second discharge period of time (dcha2).

Subsequently, the discharging circuit 308 provides a second output voltage corresponding to the first voltage ($V_H$) to the data lines D1 to D6. In this case, the switches SW1 to SW6 are turned off in sequence in units of N (integer of above 1, preferably 1) switch in the direction of the data line D1 from the data line D6. In other words, in case that N is 1, the switches SW1 to SW6 are turned off in order of SW6, SW5, SW4, SW3, SW2 and SW1. Accordingly, the data lines D1 to D6 are discharged up to discharge voltage between the first discharge level and the second discharge level. Here, the discharge voltages are increased in the direction of the data line D1 from the data line D6.

In a second instance, the switches SW1, SW2, SW3, SW4, SW5, SW6 and SW7 are turned on during a first sub-discharging period of time of the second discharge period of time (dcha2).

Then, the discharging circuit 308 provides the second output voltage corresponding to the first voltage ($V_H$) to the data lines D1 to D6, and so the data lines D1 to D6 are discharged up to a second discharge voltage corresponding to the second output voltage.

Subsequently, the switches SW1 to SW6 keep on condition, the switch SW7 is turned off, and the switch SW8 is turned on during a second sub-discharge period of time of the second discharge period of time (dcha2).

Then, the discharging circuit 308 provides the first output voltage corresponding to the second voltage ($V_L$) to the data lines D1 to D6. In this case, the switches SW1 to SW6 are turned off in sequence in units of N switch in the direction of the data line D6 from the data line D1. For example, in case that N is 1, the switches SW1 to SW6 are turned off in order of SW1, SW2, SW3, SW4, SW5 and SW6. Accordingly, the data lines D1 to D6 are discharged up to discharge voltages between the firs discharge level (first discharge voltage) and the second discharge level (second discharge voltage). Here, the discharge voltages are increased in the direction of the data line D1 from the data line D6.

In short, the data lines D1 to D6 are discharged up to discharge voltages corresponding to cathode voltages VC12 to VC62 of the pixels E12 to E62.

Hereinafter, the discharge voltages corresponding to the pixels E11 and E12 will be compared.

Since the cathode voltage VC12 of the pixel E12 is higher than the cathode voltage VC11 of the pixel E11, in the first discharge period of time (dcha1), the data line D1 is discharged up to a discharge voltage higher than in the second discharge period of time (dcha2) as shown in FIG. 4C.

Then, precharge current corresponding to second display data is provided to the data lines D1 to D6. Here, the second display data is inputted to the controller 302 after the first display data is inputted to the controller 302.

Subsequently, the second scan line S2 is coupled to the ground, and the other scan lines S1, S3 and S4 are coupled to the non-luminescent source.

Then, data currents I12 to I62 corresponding to the second display data are provided to the data lines D1 to D6.

In this case, though the cathode voltage VC12 of the pixel E12 is higher than the cathode voltage VC11 of the pixel E11, charge amount consumed until an anode voltage VA12 of the pixel E12 is saturated is substantially identical to that consumed until the anode voltage VA11 of the pixel E11 is saturated because the precharge voltage corresponding to the pixel E12 is higher than the precharge voltage corresponding to the pixel E11. Accordingly, the brightness (VA12-VC12) of the pixel E12 is substantially identical to that (VA11-VC11) of the pixel E11.

Discharge voltage and precharge voltage of data line in the light emitting device of the present invention are adjusted in accordance with cathode voltage of pixel related to the data line unlike a method in Related Art. Accordingly, in case that pixels are preset to have the same brightness, the pixels emit light having the same brightness irrespective of cathode voltages of the pixels.

In short, a cross-talk phenomenon and a pectinated pattern are not occurred on the panel 300 in the light emitting device of the present invention.

Figure 5:
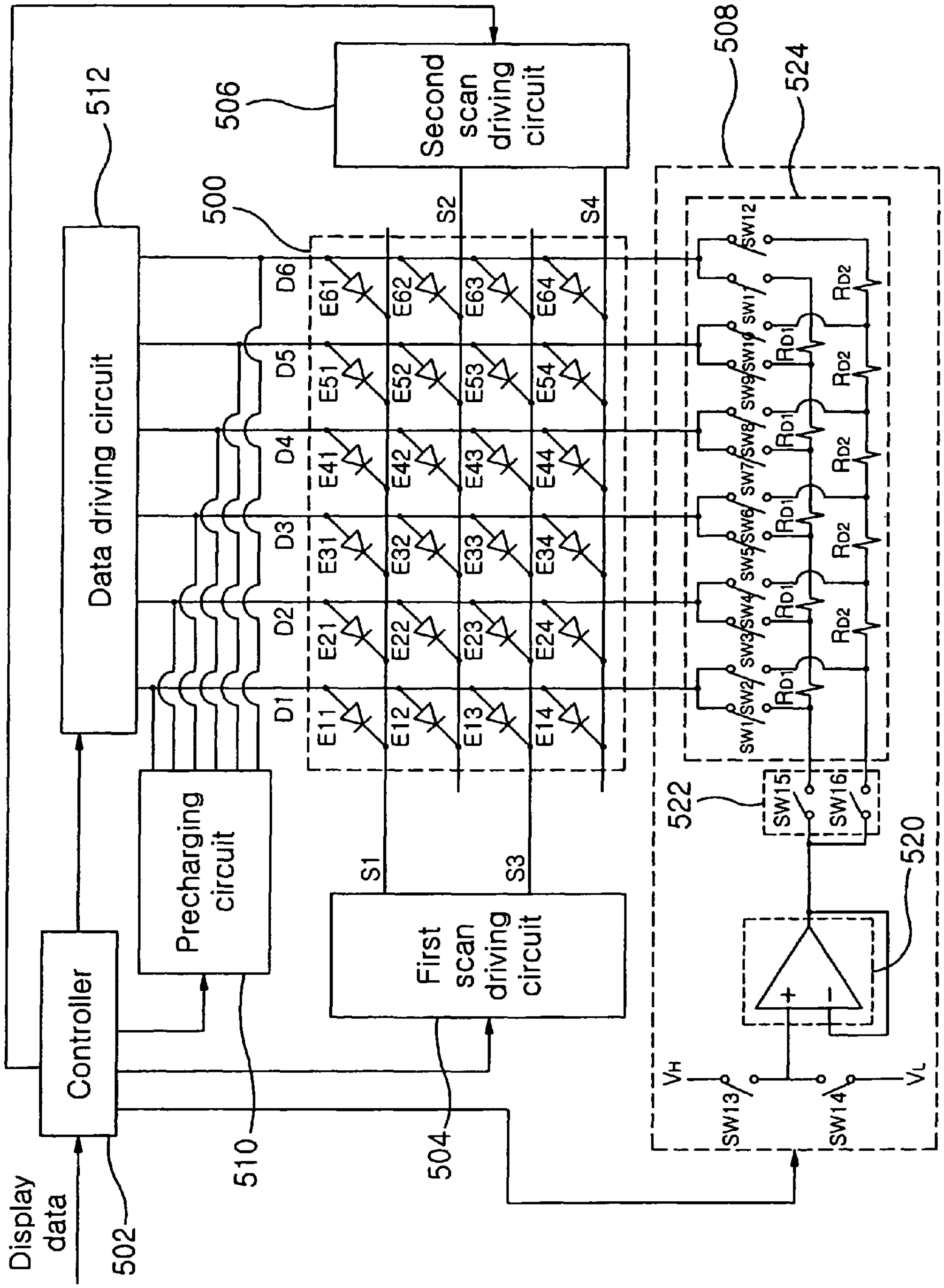
FIG. 5 is a view illustrating a light emitting device according to a second embodiment of the present invention.

FIG. 5 is a view illustrating a light emitting device according to a second embodiment of the present invention.

In FIG. 5, the light emitting device of the present invention includes a panel 500, a controller 502, a first scan driving circuit 504, a second scan driving circuit 506, a discharging circuit 508, a precharging circuit 510 and a data driving circuit 512.

Since the elements of the present embodiment except the discharging circuit 508 are the same as in the first embodiment, any further description concerning the same element will be omitted.

The discharging circuit 508 includes a sub-discharging circuit 520, a switching circuit 522 and a discharging level circuit 524.

The discharging level circuit 524 has a plurality of switches SW1 to SW12.

The sub-discharging circuit 520 provides certain current to the data lines D1 to D6.

The switching circuit 522 includes switches SW15 and SW16.

Hereinafter, operation of the discharging circuit 508 in accordance with the process of discharging will be described in detail.

Firstly, when an input terminal of an OP amplifier is coupled to a first voltage source having a first voltage ($V_H$), the switches SW1, SW3, SW5, SW7, SW9, SW11 and SW15 are turned on, and the other switches SW2, SW4, SW6, SW8, SW10, SW12 and SW16 are turned of. In this case, resistors $R_{D1}$ between the data lines D1 to D6 have first resistances.

Whereas, when the input terminal of the OP amplifier is coupled to a second voltage source having a second voltage ($V_L$), the switches SW2, SW4, SW6, SW8, SW10, SW12 and SW16 are turned on, and the switches SW1, SW3, SW5, SW7, SW9, SW11 and SW15 are turned off. In this case, resistors $R_{D2}$ between the data lines D1 to D6 have second resistances different from the first resistances. To ensure adequate discharge period of time so that discharge voltages corresponding to the data lines D1 to D6 form a constant slope as shown in FIG. 3B, it is desirable that the second resistance is higher than the first resistance.

Since a process of discharging in present embodiment is similar to a process of discharging in first embodiment, description concerning the process of discharging will be omitted.

Figure 6:
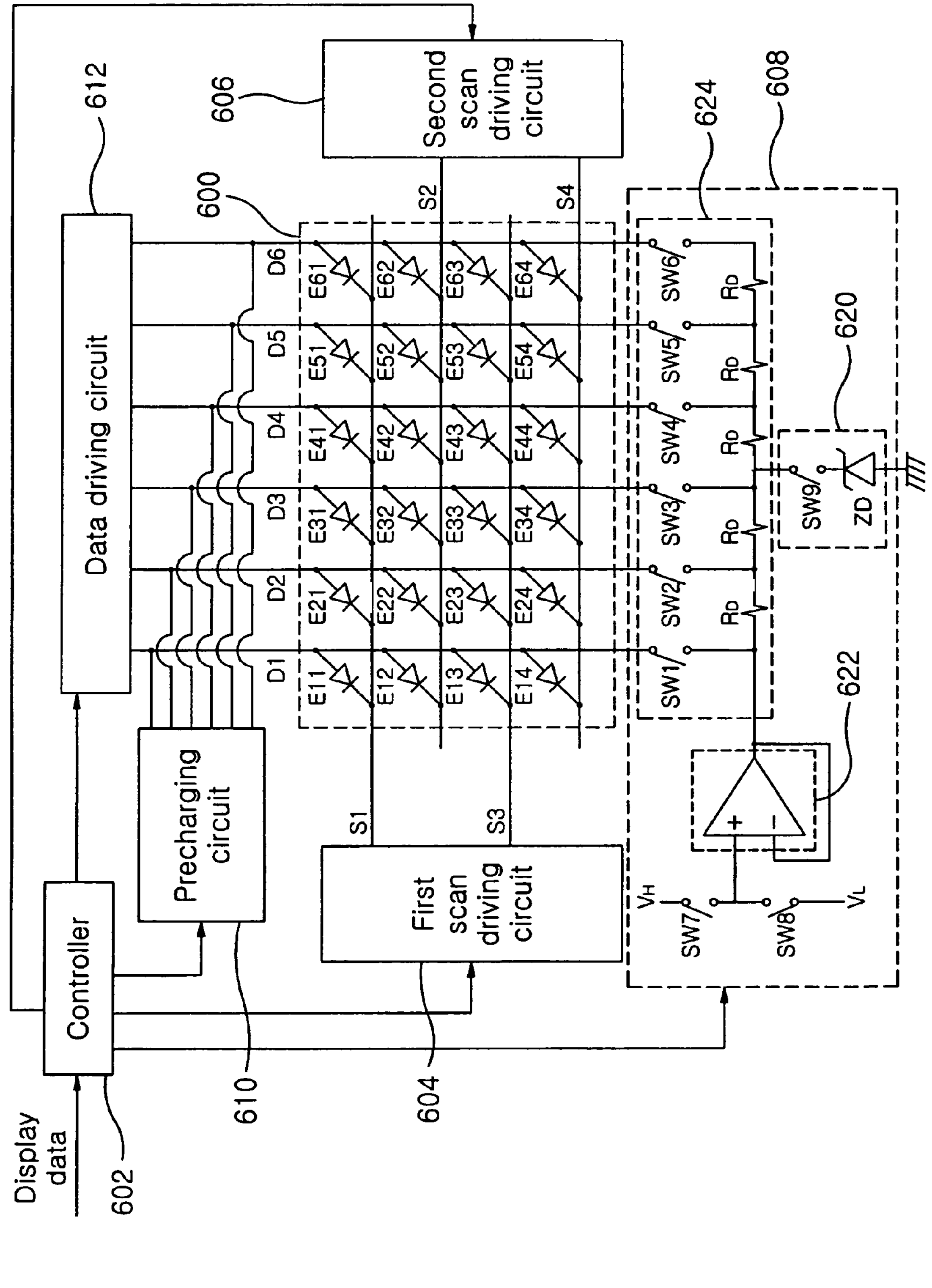
FIG. 6 is a view illustrating a light emitting device according to a third embodiment of the present invention.

FIG. 6 is a view illustrating a light emitting device according to a third embodiment of the present invention.

In FIG. 6, the light emitting device of the present invention includes a panel 600, a controller 602, a first scan driving circuit 604, a second scan driving circuit 606, a discharging circuit 608, a precharging circuit 610 and a data driving circuit 612.

Since the elements of the present embodiment except the discharging circuit 608 are the same as in the first embodiment, any further description concerning the same elements will be omitted.

The discharging circuit 608 includes a first sub-discharging circuit 620, a second sub-discharging circuit 622 and a discharging level circuit 624.

The first sub-discharging circuit 620 discharges the data lines D1 to D6 up to a certain discharge voltage. For example, the first sub-discharging circuit 620 discharges the data lines D1 to D6 up to a zener voltage of zener diode ZD using the zener diode ZD as shown in FIG. 6.

The second sub-discharging circuit 622 and the discharging level circuit 624 are the same as in the first embodiment, any further description concerning the sub-discharging circuit 622 and the discharging level circuit 624 will be omitted.

Hereinafter, the light emitting device in the first embodiment and the light emitting device in the third embodiment will be compared.

In the first embodiment, the light emitting device compensates the cathode voltages VC11 to VC64 by using only current outputted from the OP amplifiers 332 and 336, and so power consumption of the light emitting device is high. However, in the third embodiment, the light emitting device compensates the cathode voltages VC11 to VC64 by using the OP amplifiers 532 and 536 after discharging the data lines D1 to D6 up to a certain discharge voltage using the zener diode ZD. Accordingly, the power consumption of the light emitting device in the third embodiment is lower than that of the light emitting device in the first embodiment.

Figure 7:
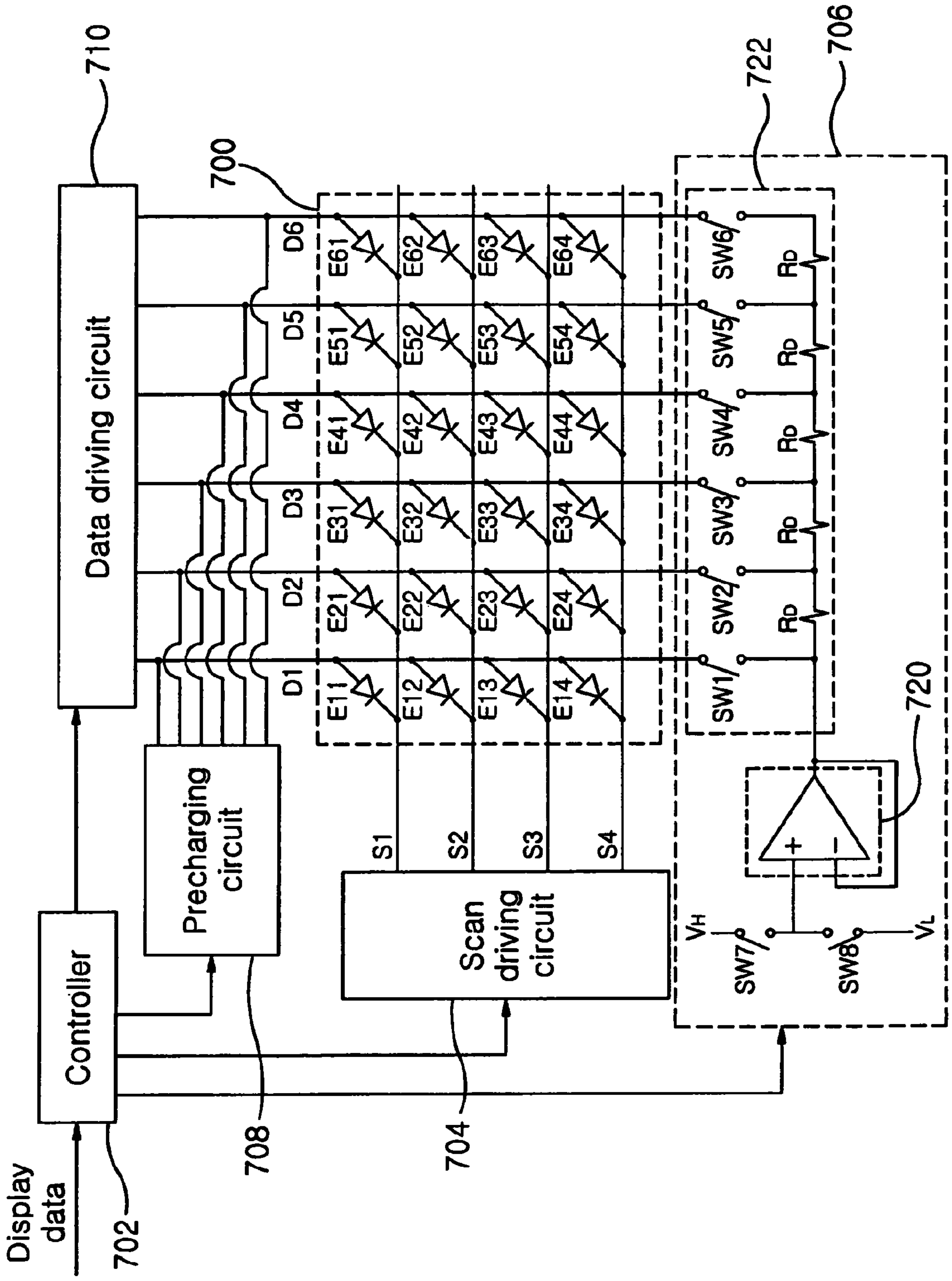
FIG. 7 is a view illustrating a light emitting device according to a fourth embodiment of the present invention.

FIG. 7 is a view illustrating a light emitting device according to a fourth embodiment of the present invention.

In FIG. 7, the light emitting device of the present embodiment includes a panel 700, a controller 702, a scan driving circuit 704, a discharging circuit 706, a precharging circuit 708 and a data driving circuit 710.

Since the elements of the present embodiment except the scan driving circuit 704 are the same as in the first embodiment, any further description concerning the same elements will be omitted.

In the fourth embodiment, the scan driving circuit 704 is formed in one direction of the panel 700 as shown in FIG. 7 unlike the other embodiments.

Figure 8A:
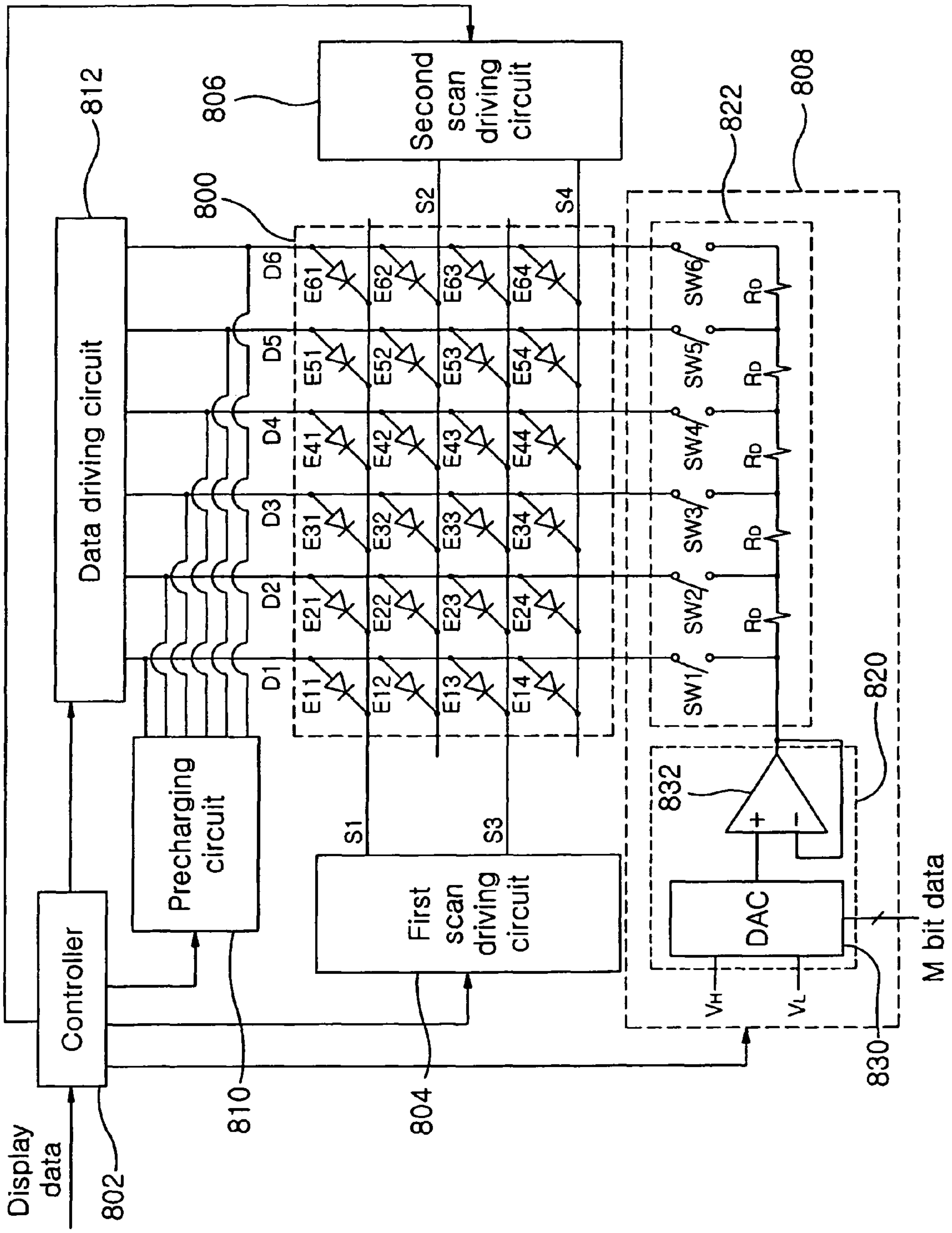
FIG. 8A is a view illustrating a light emitting device according to a fifth embodiment of the present invention.
Figure 8B:
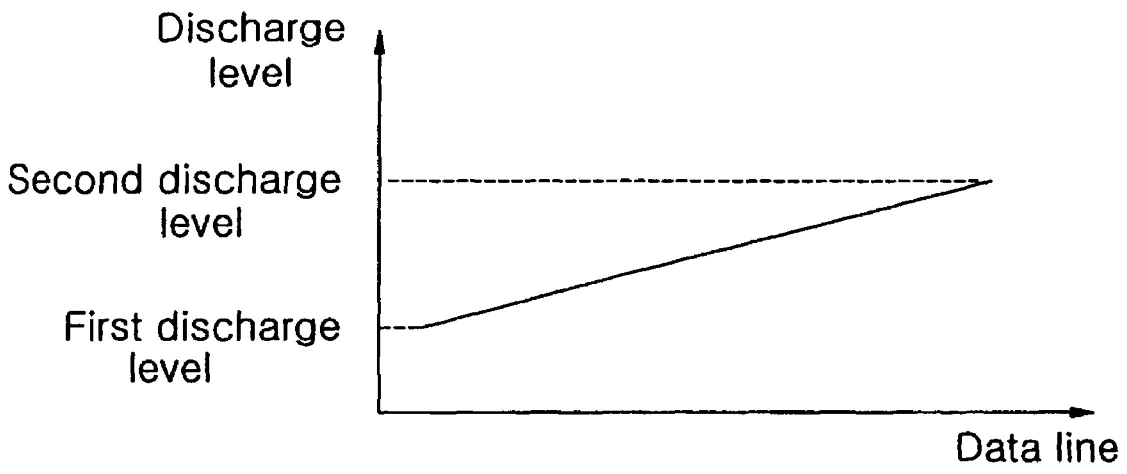
FIG. 8B is a view illustrating a discharge level graph in accordance with operation of a discharging circuit in FIG. 8A.

FIG. 8A is a view illustrating a light emitting device according to a fifth embodiment of the present invention. FIG. 8B is a view illustrating a discharge level graph in accordance with operation of a discharging circuit in FIG. 8A.

In FIG. 8A, the light emitting device of the present invention includes a panel 800, a controller 802, a first scan driving circuit 804, a second scan driving circuit 806, a discharging circuit 808, a precharging circuit 810 and a data driving circuit 812.

The panel 800 has a plurality of pixels E11 to E64 formed in cross areas of data lines D1 to D6 and scan lines S1 to S4.

The controller 802 receives display data from an outside apparatus (not shown), and controls the scan driving circuits 804 and 806, the discharging circuit 808, the precharging circuit 810 and the data driving circuit 812.

The first scan driving circuit 804 transmits first scan signals to some of the scan lines S1 to S4, e.g. S1 and S3.

The second scan driving circuit 806 transmits second scan signals to the other scan lines S2 and S4. As a result, the scan lines S1 to S4 are coupled to a luminescent source, e.g. ground.

The discharging circuit 808 discharges the data lines D1 to D6 up to discharge voltages corresponding to cathode voltages of pixels related to the data lines D1 to D6, and includes a sub-discharging circuit 820 and a discharging level circuit 822.

The discharging level circuit 822 has a plurality of switches SW1 to SW6 for coupling the data lines D1 to D6 to the sub-discharging circuit 820.

The sub-discharging circuit 820 includes a digital-analog converter 830 (hereinafter, referred to as "DAC") and an OP amplifier 832.

The DAC 830 has a first input terminal coupled to a first voltage source having a first voltage ($V_H$) and a second input terminal coupled to a second voltage source having a second voltage ($V_L$) which is smaller than the first voltage ($V_H$). Additionally, the DAC 830 receives M (integer of above 2) bit data, and outputs certain voltages in accordance with the M bit data.

Subsequently, the discharging level circuit 822 turns on the switches SW1 to SW6.

Then, the OP amplifier 832 provides certain voltages to the data lines D1 to D6 during a discharge period of time in accordance with voltage outputted from the DAC 830, and so the data lines D1 to D6 are discharged up to discharge voltages having values between a first discharge level corresponding to the second voltage ($V_L$) and a second discharge level corresponding to the first voltage ($V_H$) as shown in FIG. 8B. That is, the data lines D1 to D6 are discharged up to discharge voltages having constant slope (straight line or curve) as shown in FIG. 8B. Here, the discharge voltages correspond to cathode voltages of pixels related to the data lines D1 to D6.

In one embodiment of the present invention, the OP amplifier 832 may provide certain currents to the data lines D1 to D6 so that the data lines D1 to D6 have the discharge voltages.

In FIG. 8B, the magnitude of discharge voltages is increased in the direction of the data line D6 from the data line D1. However, the magnitude of discharging voltages may be decreased in the direction of the data line D6 from the data line D1. This will be described in detail with reference to the accompanying drawings.

The precharging circuit 810 provides precharge currents corresponding to the display data to the discharged data lines D1 to D6 under control of the controller 802.

The data driving circuit 812 provides data signals, i.e. data currents corresponding to the display data and synchronized with the scan signals to the precharged data lines D1 to D6 under control of the controller 802. As a result, the pixels E11 to E64 emit light.

Figure 9A:
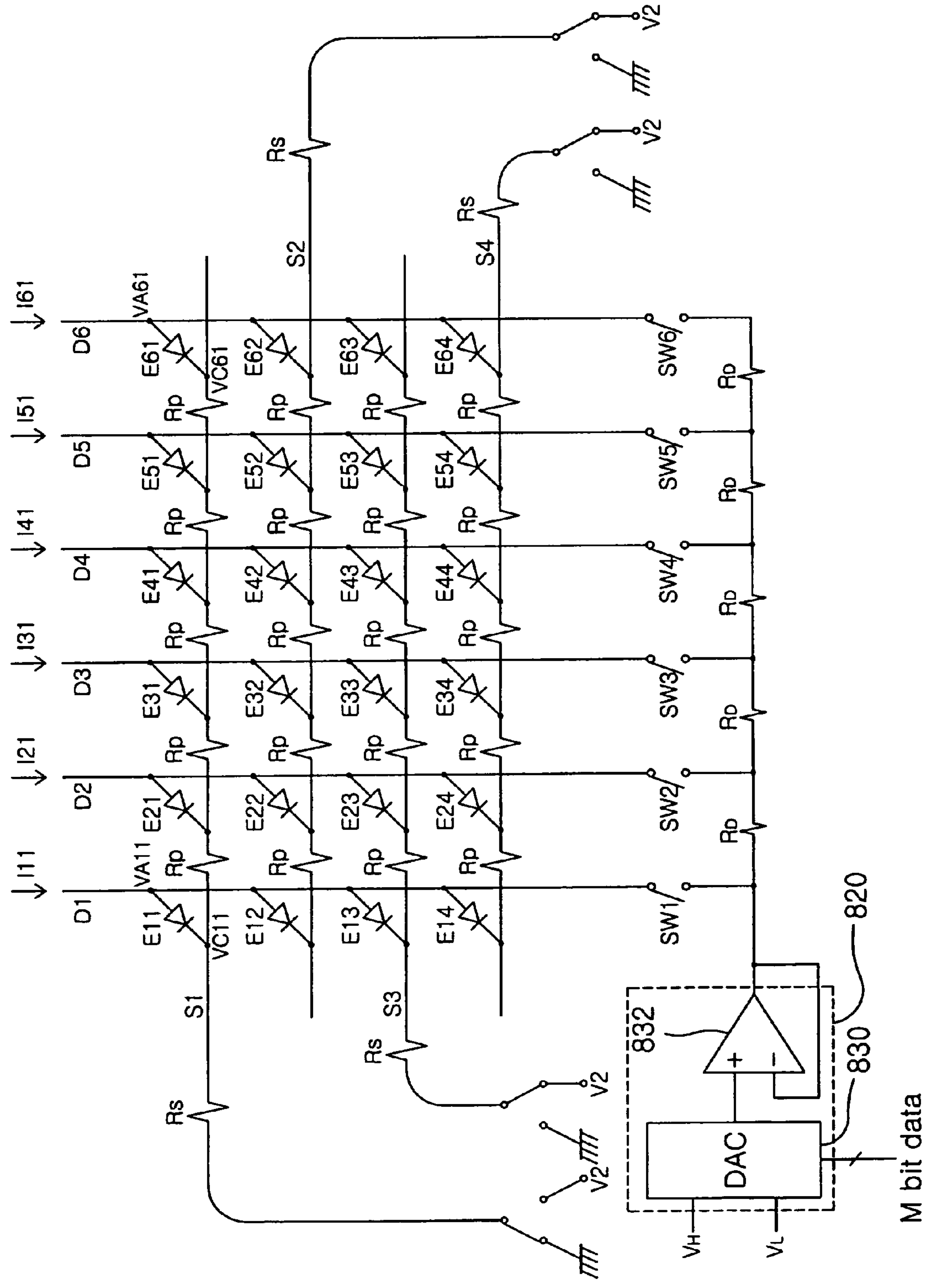
FIG. 9A and FIG. 9B are views illustrating schematically circuitries the light emitting device in FIG. 8A.
Figure 9B:
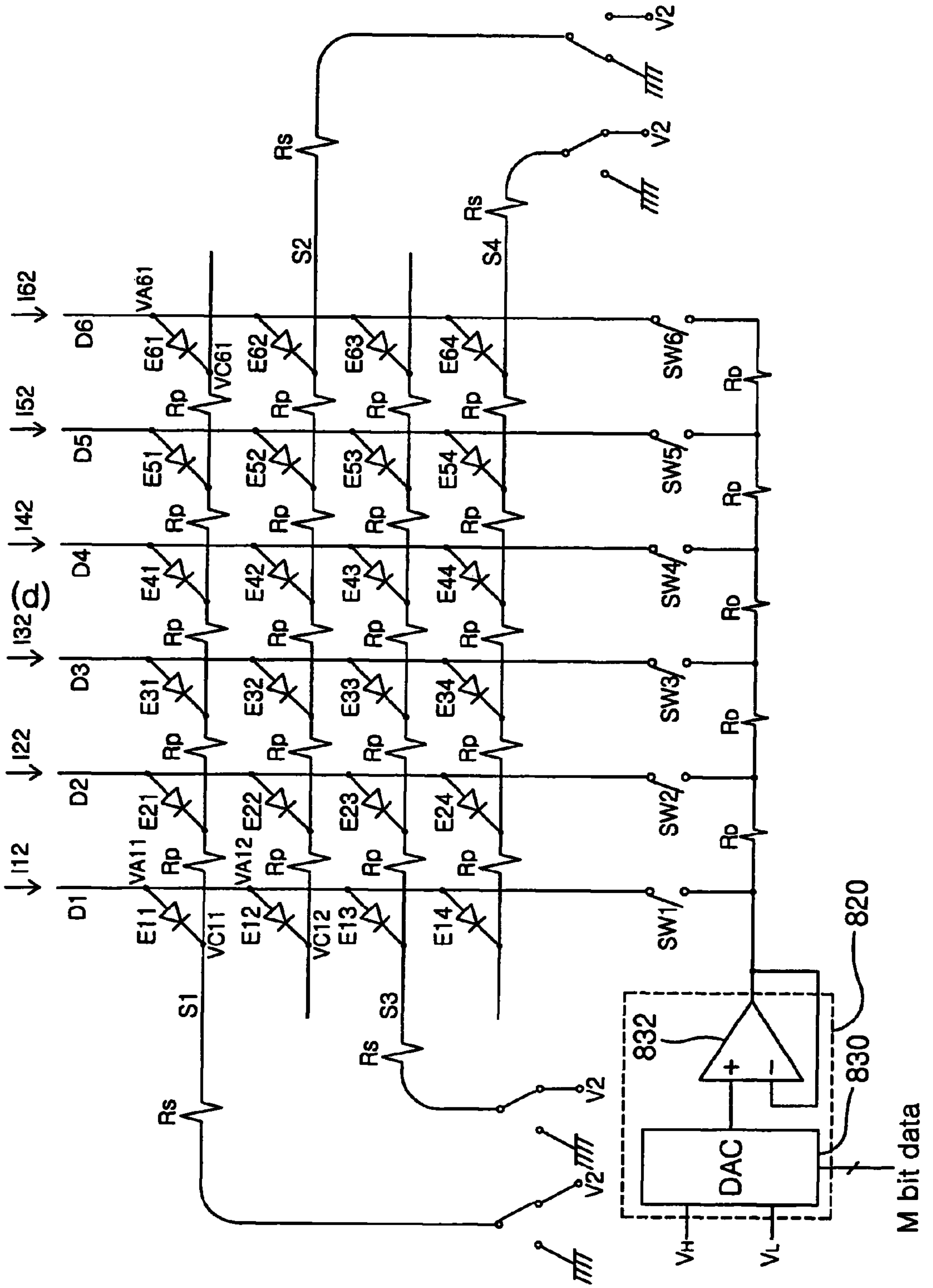

FIG. 9A and FIG. 9B are views illustrating schematically circuitries the light emitting device in FIG. 8A.

Hereinafter, a process of driving the light emitting device will be described after cathode voltages VC11 to VC61 of the pixels E11 to E61 related to the first scan line S1 are compared.

As shown in FIG. 9A, a resistor between the pixel E11 and the ground is Rs, and a resistor between the pixel E21 and the ground is Rs+Rp. In addition, a resistor between a pixel E31 and the ground is Rs+2Rp, and a resistor between a pixel E41 and the ground is Rs+3Rp. Further, a resistor between a pixel E51 and the ground is Rs+4Rp, and a resistor between a pixel E61 and the ground is Rs+5Rp.

Here, it is assumed that data currents I11 to 161 having the same magnitude are provided to the data lines D1 to D6 so that the pixels E11 to E61 have the same brightness.

In this case, the data currents I11 to I61 are passed to the ground through corresponding pixel and the first scan line S1. Accordingly, since the data currents I11 to I61 have the same magnitude, each of the cathode voltages VC11 to VC61 of the pixels E11 to E61 are proportioned to a corresponding pixel and the resistor between the corresponding pixel and the ground. Hence, the values are high in the order of VC61, VC51, VC41, VC31, VC21 and VC11.

In FIG. 9B, a resistor between a pixel E12 and the ground is Rs+5Rp, and is higher than the resistor between the pixel E11 and the ground. Here, it is assumed that the data current I11 passing through the first data line D1 when the first scan line S1 is coupled to the ground is identical to data current I12 passing through the first data line D1 when a second scan line S2 is coupled to the ground. In this case, because cathode voltages VC11 and VC12 of the pixels E11 and E12 are proportioned to corresponding resistor, the cathode voltage VC12 is higher than the cathode voltage VC11.

Hereinafter, a process of driving the light emitting device will be described in detail.

The discharging circuit 808 discharges the data lines D1 to D6.

Hereinafter, a process of discharging the data lines D1 to D6 will be described in detail using instances. Here, the scan lines S1 to S4 are coupled to the non-luminescent source during a discharge period of time and the scan line S1 is coupled to the luminescent source, e.g. ground during a luminescent time (t1).

In a first instance, the switches SW1 to SW6 are turned on during a first sub-discharge period of time of the first discharge period of time (dcha1).

Subsequently, the DAC 830 outputs voltage corresponding to lowest rank data of the M bit data, i.e. voltage corresponding to the second voltage ($V_L$). For example, in case that M is 5, the DAC 830 outputs voltage corresponding to lowest rank data [0, 0, 0, 0, 0] of the 5 bit data.

Then, the OP amplifier 832 provides a first op amp output voltage corresponding to the second voltage ($V_L$) to the data lines D1 to D6 in accordance with the voltage outputted from the DAC 830. As a result, the data lines D1 to D6 are discharged up to a first discharge voltage corresponding to the second voltage ($V_L$).

In one embodiment of the present invention, the OP amplifier 832 may provide certain current corresponding to the second voltage ($V_L$) to the data lines D1 to D6 in accordance with the voltage outputted from the DAC 830 so that the data lines D1 to D6 are discharged up to the first discharge voltage.

Subsequently, the DAC 830 outputs voltage corresponding to data [0, 0, 0, 0, 1] next to the lowest rank data [0, 0, 0, 0, 0] during a second sub-discharge period of time of the first discharge period of time (dcha1).

Then, the OP amplifier 832 provides a second op amp output voltage corresponding to the data [0, 0, 0, 0, 1] to the data lines D1 to D6 in accordance with the voltage outputted from the DAC 830. In this case, the switch SW1 is turned off, and the other switches SW2 to SW6 keep on condition.

Subsequently, the DAC 830 outputs voltage corresponding to data [0, 0, 0, 1, 0] next to the data [0, 0, 0, 0, 1].

Then, the OP amplifier 832 provides a third op amp output voltage corresponding to the data [0, 0, 0, 1, 0] to the data lines D1 to D6 in accordance with the voltage outputted from the DAC 830. In this case, the switch SW1 keeps off condition, the switch SW2 is turned off, and the other switches SW3 to SW6 keep on condition.

The above process is performed until highest rank data of the M bit data, e.g. data [1, 1, 1, 1, 1] are finished. In this case, the switches SW1 to SW6 are turned off in sequence in accordance with data change. As a result, the data lines D1 to D6 are discharged up to discharge voltages forming a constant slope (straight line or curve) as shown in FIG. 8B.

In a second instance, the switches SW1 to SW6 are turned on during a first sub-discharge period of time of the first discharge period of time (dcha1).

Subsequently, the DAC 830 outputs voltage corresponding to highest rank data of the M bit data, i.e. voltage corresponding to the first voltage ($V_H$). For example, in case that M is 5, the DAC 830 outputs the voltage corresponding to the highest rank data [1, 1, 1, 1, 1] of the 5 bit data.

Then, the OP amplifier 832 provides a fourth op amp output voltage corresponding to the first voltage ($V_H$) to the data lines D1 to D6 in accordance with the voltage outputted from the DAC 830. As a result, the data lines D1 to D6 are discharged up to a second discharge voltage corresponding to the first voltage ($V_L$).

Subsequently, the DAC 830 outputs voltage corresponding to data [1, 1, 1, 1, 0] next to the highest rank data [1, 1, 1, 1, 1] during a second sub-discharge period of time of the first discharge period of time (dcha1).

Then, the OP amplifier 832 provides a fifth op amp output voltage corresponding to the data [1, 1, 1, 1, 0] to the data lines D1 to D6 in accordance with the voltage outputted from the DAC 830. In this case, the switch SW6 is turned off, and the other switches SW1 to SW5 keep on condition.

Subsequently, the DAC 830 outputs voltage corresponding to data [1, 1, 1, 0, 1] next to the data [1, 1, 1, 1, 0].

Then, the OP amplifier 832 provides a sixth op amp output voltage corresponding to the data [1, 1, 1, 0, 1] to the data lines D1 to D6 in accordance with the voltage outputted from the DAC 830. In this case, the switch SW6 keeps off condition, the switch SW5 is turned off, and the other switches SW1 to SW4 keep on condition.

The above process is performed until lowest rank data of the M bit data, e.g. data [0, 0, 0, 0, 0] are finished. In this case, the switches SW1 to SW6 are turned off in sequence in the direction of the data line D1 from the data line D6 in accordance with data change. As a result, the data lines D1 to D6 are discharged up to discharge voltages forming a constant slope (straight line or curve) as shown in FIG. 8B.

In brief, the data lines D1 to D6 are discharged up to discharge voltages corresponding to cathode voltages VC11 to VC61 of pixels E11 to E61 related to the data lines D1 to D6. In the above case, since the cathode voltage VC61 is higher than the cathode voltage VC11, the second discharge level is higher than the first discharge level.

In the above process, the switches SW1 to SW6 are turned off in sequence in unit of 1 switch during the second sub-discharge period of time. However, the switches SW1 to SW6 are turned off in sequence in units of above 2 switches. In other words, the switches SW1 to SW6 are turned off in sequence in units of N (integer of above 1) switch during the second sub-discharge period of time.

Hereinafter, the pixel E61 is preset to have the same brightness as the pixel E11. That is, data currents I11 and I61 having the same magnitude are provided to the data lines D1 and D6 during the first luminescent period of time t1.

In this case, because the cathode voltage VC61 is higher than the cathode voltage VC11, the data line D6 is discharged up to a discharge voltage higher than a discharge voltage corresponding to the data line D1 during a first discharge period of time as shown in FIG. 4D. Thus, the data line D6 is precharged up to a second precharge voltage higher than a first precharge voltage corresponding to the data line D1.

Subsequently, the first scan line S1 is coupled to the ground, and the other scan lines S2 to S4 are coupled to the non-luminescent source.

Then, the data currents I11 and I61 having the same magnitude and corresponding to first display data are provided to the data lines D1 and D6, respectively. In this case, since the pixels E11 and E61 are preset to emit light having the same brightness, anode voltages VA11 and VA61 of the pixels E11 and E61 rise from the precharge voltage to a voltage which is different from corresponding cathode voltages VC11 and VC61 by a certain level, and then the voltages VA11 and VA61 are saturated. This is because a pixel emits a light having brightness corresponding to difference of its anode voltage and its cathode voltage.

For example, in case that the cathode voltage VC11 of the pixel E11 and the cathode voltage VC61 of the pixel E61 are 1V and 2V, respectively, the anode voltage V61 of the pixel E61 is saturated with 7V when the anode voltage VA11 of the pixel E11 is saturated with 6V. In this case, because the data line D6 is precharged up to the second precharge voltage higher than the first precharge voltage corresponding to the data line D1, the anode voltage VA11 of the pixel E11 rises from the first precharge voltage, e.g. 3V to 6V, and then is saturated with 6V. Whereas, the anode voltage VA61 of the pixel E61 rises from the second precharge voltage, e.g. 4V to 7V, and then is saturated with 7V. In other words, the anode voltages VA11 and VA61 of the pixels E11 and E61 rise from corresponding cathode voltages VC11 and VC61 by the same level as shown in FIG. 4D, and then are saturated. Accordingly, charge amount consumed until the anode voltage VA61 of the pixel E61 is saturated is substantially identical to that consumed until the anode voltage VA11 of the pixel E11 is saturated. Hence, in case that the pixels E11 and E61 are preset to emit light having the same brightness, the brightness (VA61-VC61) of the pixel E61 is substantially identical to the brightness (VA11-VC11) of the pixel E11.

In addition, the pixels E21 to E51 operate in the above method. Accordingly, when the pixels E11 to E61 are preset to have the same brightness, the pixels E11 to E61 emit light having substantially the same brightness.

Hereinafter, the process of driving the light emitting device will be continuously described in detail.

The discharging circuit 808 discharges the data lines D1 to D6 during a second discharge period of time (dcha2).

Hereinafter, a process of discharging will be described in detail using instances.

In a first instance, the switches SW1 to SW6 are turned on during a first sub-discharge period of time of a second discharge period of time (dcha2).

Subsequently, the DAC 830 outputs voltage corresponding to lowest rank data of the M bit data, i.e. voltage corresponding to the second voltage ($V_L$). For example, in case that M is 5, the DAC 830 outputs the voltage corresponding to lowest rank data [0, 0, 0, 0, 0] of the 5 bit data.

Then, the OP amplifier 832 provides a seventh op amp output voltage corresponding to the second voltage ($V_L$) to the data lines D1 to D6 in accordance with the voltage outputted from the DAC 830. As a result, the data lines D1 to D6 are discharged up to a first discharge voltage, e.g. first discharge level corresponding to the second voltage ($V_L$).

Subsequently, the DAC 830 outputs voltage corresponding to data [0, 0, 0, 0, 1] next to the lowest rank data [0, 0, 0, 0, 0] during a second sub-discharge period of time of the second discharge period of time (dcha2).

Then, the OP amplifier 832 provides an eighth op amp output voltage corresponding to the data [0, 0, 0, 0, 1] to the data lines D1 to D6 in accordance with the voltage outputted from the DAC 830. Here, the switch SW6 is turned off, and the other switches SW1 to SW5 keep on condition.

Subsequently, the DAC 830 outputs voltage corresponding to data [0, 0, 0, 1, 0] next to the data [0, 0, 0, 0, 1].

Then, the OP amplifier 832 provides a ninth op amp output voltage corresponding to the data [0, 0, 0, 1, 0] to the data lines D1 to D6 in accordance with the voltage outputted from the DAC 830. Here, the switch SW6 keeps on condition, the switch SW5 is turned off, and the other switches SW1 to SW4 keep on condition.

The above process is performed until highest rank data of the M bit data, e.g. data [1, 1, 1, 1, 1] are finished. In this case, the switches SW1 to SW6 are turned off in sequence in the direction of the data line D1 from the data line D6 in accordance with data change. As a result, the data lines D1 to D6 are discharged up to discharge voltages forming a constant slope (straight line or curve) as shown in FIG. 8B.

In a second instance, the switches SW1 to SW6 are turned on during the first sub-discharge period of time of the second discharge period of time (dcha2).

Subsequently, the DAC 830 outputs voltage corresponding to highest rank data of the M bit data, i.e. voltage corresponding to the first voltage ($V_H$). For example, in case that M is 5, the DAC 830 outputs voltage corresponding to the highest rank data [1, 1, 1, 1, 1].

Then, the OP amplifier 832 provides a tenth op amp output voltage corresponding to the first voltage ($V_H$) to the data lines D1 to D6 in accordance with the voltage outputted from the DAC 830. As a result, the data lines D1 to D6 are discharged up to a second discharge voltage corresponding to the first voltage ($V_H$).

Subsequently, the DAC 830 outputs voltage corresponding to data [1, 1, 1, 1, 0] next to the highest rank data [1, 1, 1, 1, 1] during the second sub-discharge period of time of the second discharge period of time (dcha2).

Then, the OP amplifier 832 provides an eleventh op amp output voltage corresponding to the data [1, 1, 1, 1, 0] to the data lines D1 to D6 in accordance with the voltage outputted from the DAC 830. Here, the switch SW1 is turned off, and the other switches SW2 to SW6 keep on condition.

Subsequently, the DAC 830 outputs voltage corresponding to data [1, 1, 1, 0, 1] next to the data [1, 1, 1, 1, 0].

Then, the OP amplifier 832 provides a twelfth op amp output voltage corresponding to the data [1, 1, 1, 0, 1] to the data lines D1 to D6 in accordance with the voltage outputted from the DAC 830. Here, the switch SW1 keeps off condition, the switch SW2 is turned off, and the other switches SW3 to SW6 keep on condition.

The above process is performed until lowest rank data of the M bit data, e.g. data [0, 0, 0, 0, 0] are finished. In this case, the switches SW1 to SW6 are turned off in sequence in accordance with data change. As a result, the data lines D1 to D6 are discharged up to discharge voltages forming a constant slope (straight line or curve) as shown in FIG. 8B.

In short, the data lines D1 to D6 are discharged up to discharge voltages corresponding to cathode voltage VC12 to VC62 of the pixels E12 to E62.

In the above process, the switches SW1 to SW6 are turned off in sequence in unit of 1 switch during the second sub-discharge period of time. However, the switches SW1 to SW6 are turned off in sequence in units of above 2 switches.

Hereinafter, the discharge voltages corresponding to the pixels E11 and E12 will be compared.

Since the cathode voltage VC12 of the pixel E12 is higher than the cathode voltage VC11 of the pixel E11, in the first discharge period of time (dcha1), the data line D1 is discharged up to a discharge voltage higher than in the second discharge period of time (dcha2) as shown in FIG. 4C.

Then, precharge current corresponding to second display data is provided to the data lines D1 to D6. Here, the second display data is inputted to the controller 802 after the first display data is inputted to the controller 802.

Subsequently, the second scan line S2 is coupled to the ground, and the other scan lines S1, S3 and S4 are coupled to the non-luminescent source.

Then, data currents I12 to I62 corresponding to the second display data are provided to the data lines D1 to D6.

In this case, though the cathode voltage VC12 of the pixel E12 is higher than the cathode voltage VC11 of the pixel E11, charge amount consumed until an anode voltage VA12 of the pixel E12 is saturated is substantially identical to that consumed until the anode voltage VA11 of the pixel E11 is saturated because the precharge voltage corresponding to the pixel E12 is higher than the precharge voltage corresponding to the pixel E11. Accordingly, the brightness (VA12-VC12) of the pixel E12 is substantially identical to that (VA11-VC11) of the pixel E11.

In the method of driving the light emitting device, discharge voltage and precharge voltage of data line are adjusted in accordance with cathode voltage of pixel related to the data line unlike a method in Related Art. Accordingly, in case that pixels are preset to have the same brightness, the pixels emit light having the same brightness irrespective of cathode voltages of the pixels.

In short, a cross-talk phenomenon and a pectinated pattern are not occurred on the panel 800 in the light emitting device of the present invention.

Figure 10:
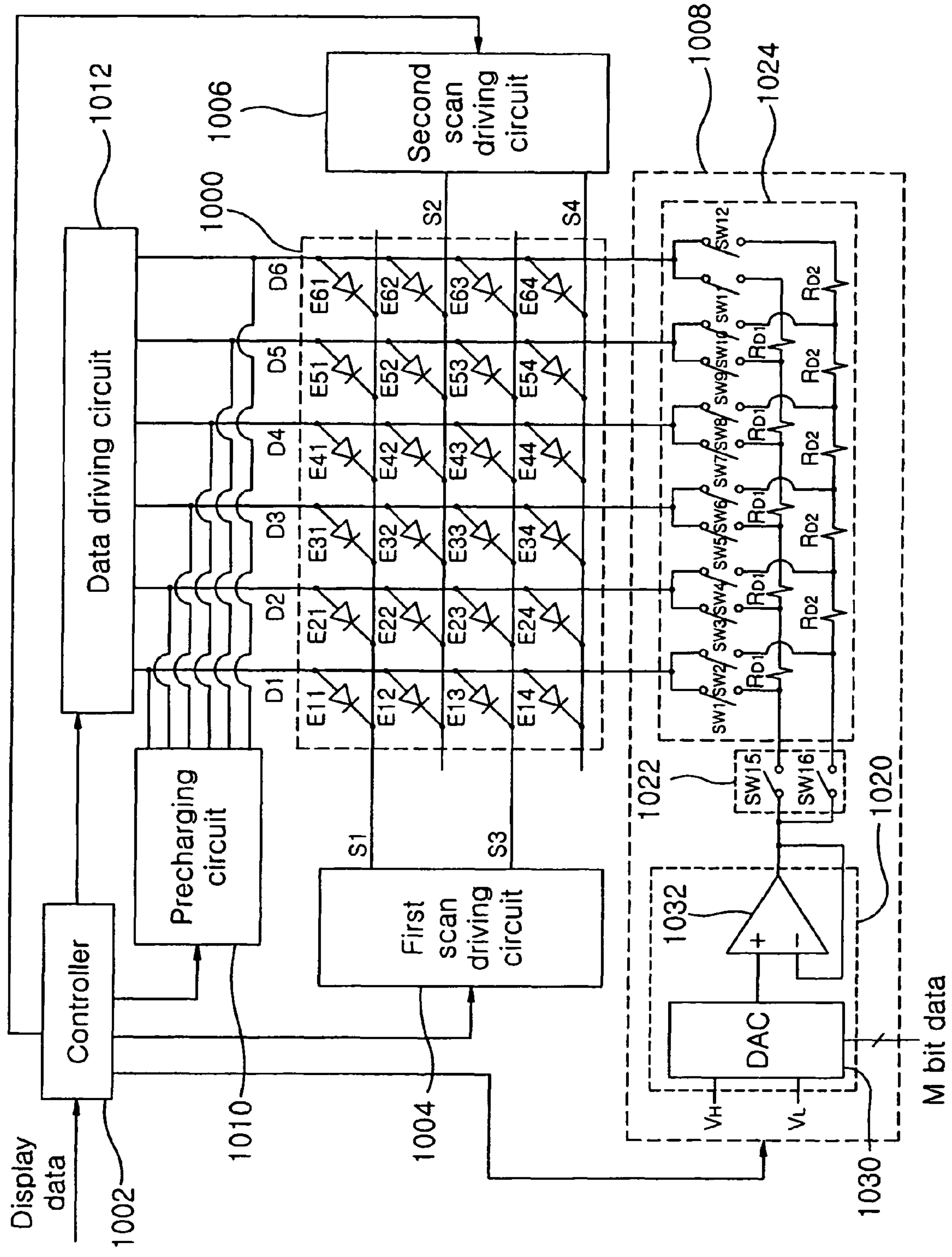
FIG. 10 is a view illustrating a light emitting device according to a sixth embodiment of the present invention.

FIG. 10 is a view illustrating a light emitting device according to a sixth embodiment of the present invention.

In FIG. 10, the light emitting device of the present invention includes a panel 1000, a controller 1002, a first scan driving circuit 1004, a second scan driving circuit 1006, a discharging circuit 1008, a precharging circuit 1010 and a data driving circuit 1012.

Since the elements of the present embodiment except the discharging circuit 1008 are the same as in the fifth embodiment, any further description concerning the same elements will be omitted.

The discharging circuit 1008 includes a sub-discharging circuit 1020, a switching circuit 1022 and a discharging level circuit 1024.

The discharging level circuit 1024 includes a plurality of switches SW1 to SW12.

The sub-discharging circuit 1020 provides certain voltages to the data lines D1 to D6.

The switching circuit 1022 has switches SW15 and SW16.

Hereinafter, operation of the discharging circuit 1008 in accordance with the process of discharging will be described in detail.

When a first input terminal of an OP amplifier is coupled to a first voltage source having a first voltage ($V_H$), the switches SW1, SW3, SW5, SW7, SW9, SW11 and SW15 are turned on, and the other switches SW2, SW4, SW6, SW8, SW10, SW12 and SW16 are turned off. In this case, resistors $R_{D1}$ have first resistances.

Whereas when a second input terminal of the OP amplifier is coupled to a second voltage source having a second voltage ($V_L$), the switches SW2, SW4, SW6, SW8, SW10 and SW16 are turned on, and the switches SW1, SW3, SW5, SW7, SW9, SW11 and SW15 are turned off. In this case, resistors $R_{D2}$ between the data lines D1 to D6 have second resistances different from the first resistances. To ensure adequate discharge period of time so that discharge voltages corresponding to the data lines D1 to D6 form a constant slope as shown in FIG. 8B, it is desirable that the second resistance is higher than the first resistance.

Since the process of discharging of the present embodiment is similar to the process of discharging in the fifth embodiment, description concerning the process of discharging will be omitted.

Figure 11:
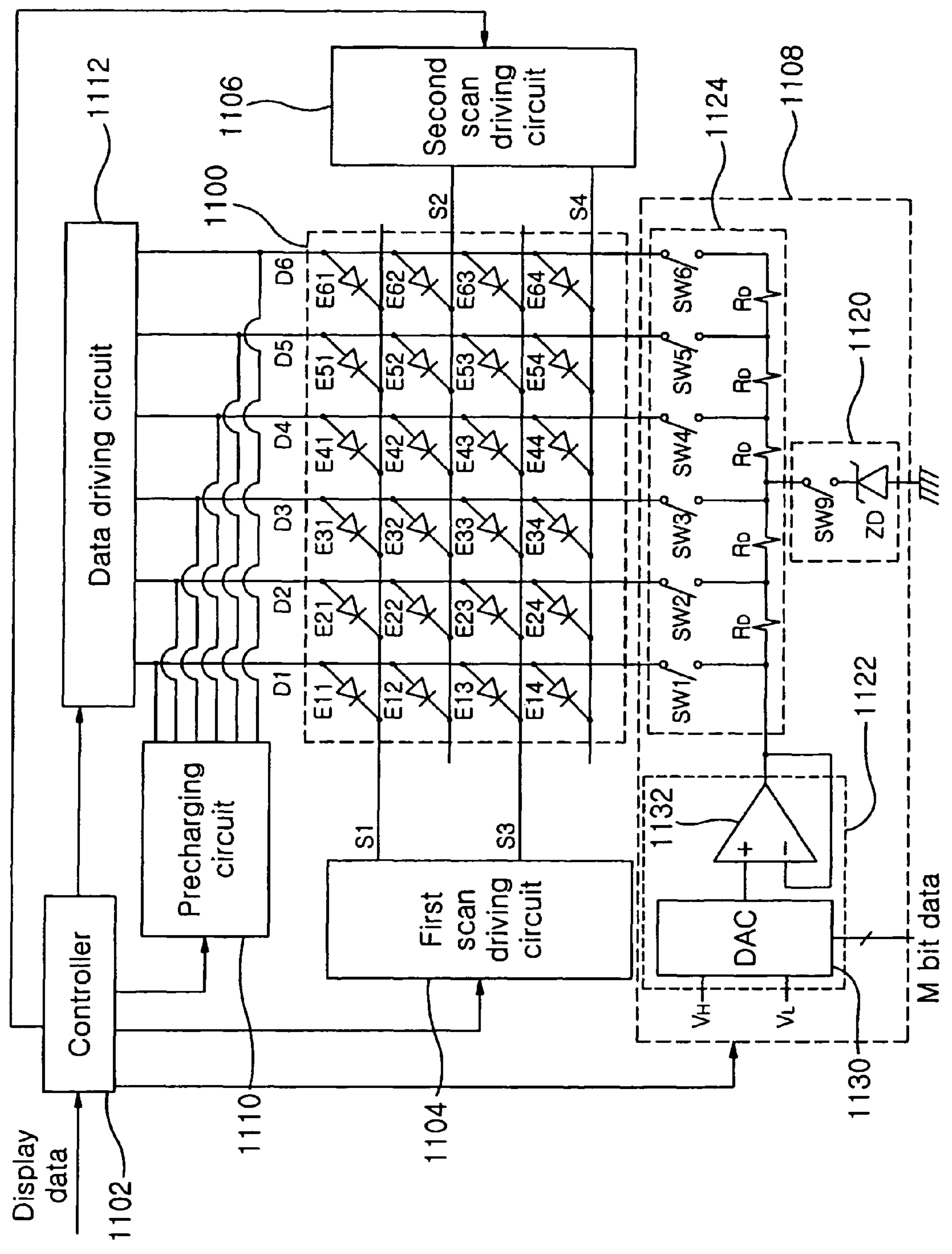
FIG. 11 is a view illustrating a light emitting device according to a seventh embodiment of the present invention.

FIG. 11 is a view illustrating a light emitting device according to a seventh embodiment of the present invention.

In FIG. 11, the light emitting device of the present invention includes a panel 1100, a controller 1102, a first scan driving circuit 1104, a second scan driving circuit 1106, a discharging circuit 1108, a precharging circuit 1110 and a data driving circuit 1112.

Since the elements of the present embodiment except the discharging circuit 1108 are the same as in the fifth embodiment, any further description concerning the same elements will be omitted.

The discharging circuit 1108 includes a first sub-discharging circuit 1120, a second sub-discharging circuit 1122 and a discharging level circuit 1124.

The first sub-discharging circuit 1120 discharges the data lines D1 to D6 up to a certain discharge voltage. For example, the first sub-discharging circuit 1120 discharges the data lines D1 to D6 up to a zener voltage of zener diode ZD using the zener diode ZD as shown in FIG. 11.

The second sub-discharging circuit 1122 and the discharging level circuit 1124 are the same as in the fifth embodiment, any further description concerning the sub-discharging circuit 1122 and the discharging level circuit 1124 will be omitted.

Hereinafter, the light emitting device in the fifth embodiment and the light emitting device in the seventh embodiment will be compared.

In the fifth embodiment, the light emitting device compensates the cathode voltages VC11 to VC64 by using only current outputted from the OP amplifiers, and so power consumption of the light emitting device is high. However, in the seventh embodiment, the light emitting device compensates the cathode voltages VC11 to VC64 by using the OP amplifiers after discharging the data lines D1 to D6 up to a certain discharge voltage using the zener diode ZD. Accordingly, the power consumption of the light emitting device in the seventh embodiment is lower than that of the light emitting device in the fifth embodiment.

Figure 12:
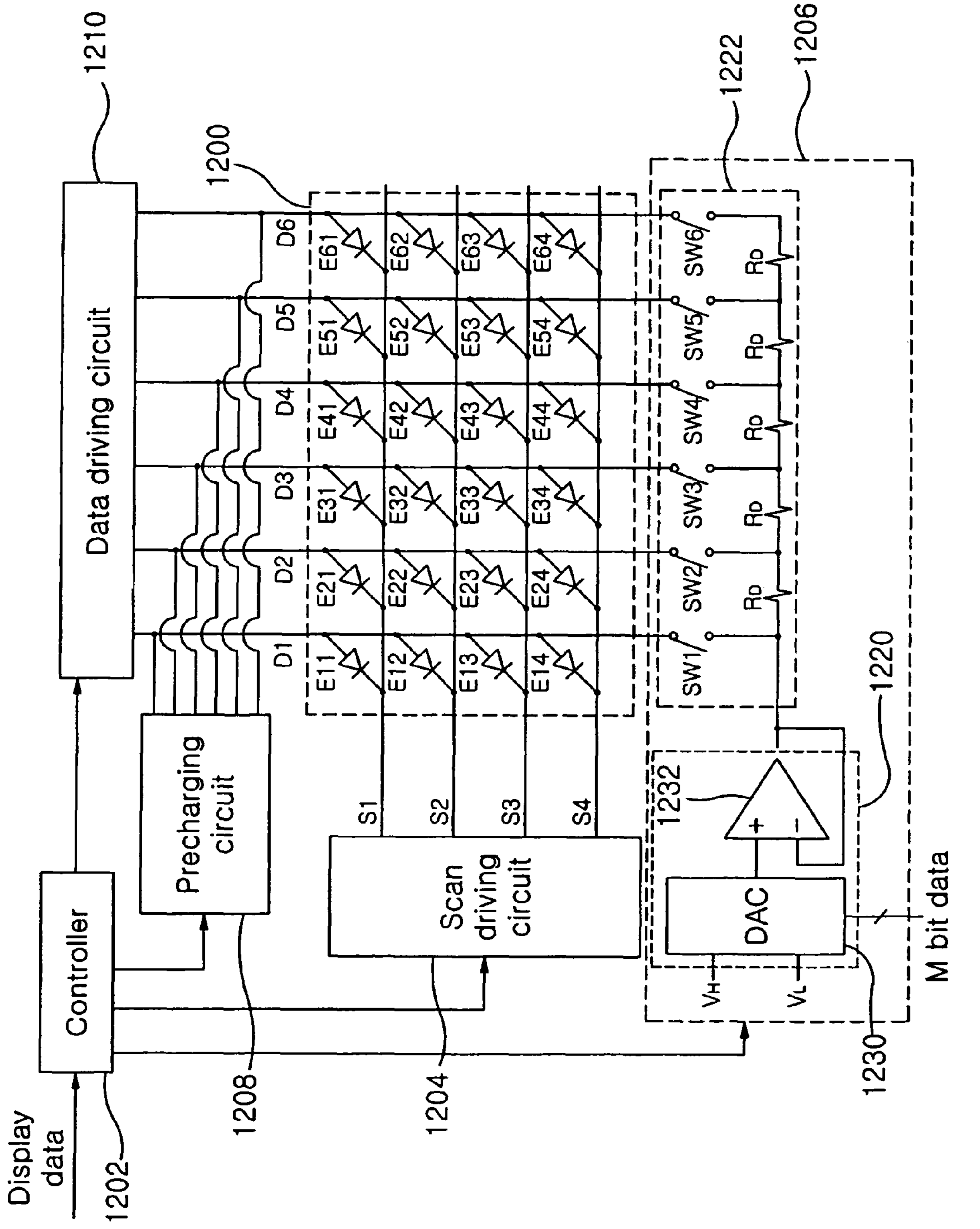
FIG. 12 is a view illustrating a light emitting device according to a eighth embodiment of the present invention.

FIG. 12 is a view illustrating a light emitting device according to a eighth embodiment of the present invention.

In FIG. 12, the light emitting device of the present embodiment includes a panel 1200, a controller 1202, a scan driving circuit 1204, a discharging circuit 1206, a precharging circuit 1208 and a data driving circuit 1210.

Since the elements of the present embodiment except the scan driving circuit 1204 are the same as in the fifth embodiment, any further description concerning the same elements will be omitted.

In the eighth embodiment, the scan driving circuit 1204 is formed in one direction of the panel 1200 as shown in FIG. 12 unlike the fifth to seventh embodiments.

From the preferred embodiments for the present invention, it is noted that modifications and variations can be made by a person skilled in the art in light of the above teachings. Therefore, it should be understood that changes may be made for a particular embodiment of the present invention within the scope and the spirit of the present invention outlined by the appended claims.

What is claimed is:

1. A light emitting device comprising:

data lines disposed in a first direction;

scan lines disposed in a second direction different from the first direction;

a plurality of pixels formed in a cross area of the data lines and the scan lines;

a discharging circuit configured to provide output voltages corresponding to data of M (integer of above 2) bit to the data lines so that the data lines have discharge voltages corresponding to cathode voltage of pixel related to the data lines, wherein the discharging circuit includes:

a sub-discharging circuit configured to provide the output voltages to the data lines; and a discharging level circuit configured to have switches for switching couple between the sub-discharging circuit and the data lines, wherein the discharging level circuit includes:

first switches configured to couple the data lines to the sub-discharging circuit during a first sub-discharging time of a discharging time and second switches configured to couple the data lines to the sub-discharging circuit during a second sub-discharging time of the discharging time, and wherein resistors between the data lines have first resistances when the first switches couple the sub-discharging circuit to the data lines, and resistors between the data lines have second resistances different from the first resistances when the second switches couple the sub-discharging circuit to the data lines.

2. The light emitting device of claim 1, wherein the switches couple the data lines to the sub-discharging circuit during a first sub-discharging time of a discharging time, and are turned off in sequence in units of N (integer of above 1) switches during a second sub-discharging time of the discharging time.

3. The light emitting device of claim 2, wherein when cathode voltage of pixel related to a first outmost data line of outmost data lines of the data lines is higher than that of pixel related to a second outmost data line of the outmost data lines, and output voltage corresponding to a lowest rank data of the data of M bit is provided to the data lines during the first sub-discharging time, the switches are turned off in sequence in units of N switches in a direction of the first outmost data line from the second outmost data line during the second sub-discharging time.

4. The light emitting device of claim 2, wherein when cathode voltage of pixel related to a first outmost data line of outmost data lines of the data lines is higher than that of pixel related to a second outmost data line of the outmost data lines, and output voltage corresponding to a highest rank data of the data of M bit is provided to the data lines during the first sub-discharging time, the switches are turned off in sequence in units of N switches in a direction of the second outmost data line from the first outmost data line during the second sub-discharging time.

5. The light emitting device of claim 1, wherein the sub-discharging circuit includes:

a digital-analog converter (DAC) configured to output a certain voltage in accordance with the data of M bit; and an OP amp configured to provide the output voltage to the data lines in accordance with voltage outputted from the DAC.

6. The light emitting device of claim 5, wherein a first input terminal of input terminals of the DAC is coupled to a first voltage source having a first voltage, a second input terminal of the input terminals is coupled to a second voltage.

7. The light emitting device of claim 1, wherein the second resistance is higher than the first resistance.

8. The light emitting device of claim 1, wherein the discharging circuit includes:

a first sub-discharging circuit configured to discharge the data lines to a certain discharge voltage;

a second sub-discharging circuit configured to provide output voltages corresponding to the data of M bit to the data lines: and a discharging level circuit configured to have switches for switching couple of the sub-discharging circuit and the data lines.

9. The light emitting device of claim 8, wherein the first sub-discharging circuit includes:

a zener diode coupled to the data lines, the second sub-discharging circuit includes:

a digital-analog converter (DAC) configured to output a certain voltage in accordance with the data of M bit; and an OP amp configured to provide the outputted voltage to the data lines in accordance with voltage outputted from the DAC.

* * * * *